(12) United States Patent
Zhao et al.

(10) Patent No.: US 11,733,326 B2
(45) Date of Patent: Aug. 22, 2023

(54) ULTRATHIN RECONFIGURABLE METAMATERIAL FOR SIGNAL ENHANCEMENT OF MAGNETIC RESONANCE IMAGING

(71) Applicant: The Board of Trustees of the University of Illinois, Urbana, IL (US)

(72) Inventors: Yang Zhao, Champaign, IL (US); Yun-Sheng Chen, Urbana, IL (US); Hanwei Wang, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 17/560,505

(22) Filed: Dec. 23, 2021

(65) Prior Publication Data
US 2022/0206089 A1 Jun. 30, 2022

Related U.S. Application Data

(60) Provisional application No. 63/130,600, filed on Dec. 24, 2020.

(51) Int. Cl.
*G01R 33/34* (2006.01)
(52) U.S. Cl.
CPC .................... *G01R 33/34* (2013.01)
(58) Field of Classification Search
CPC . G01R 33/34; G01R 33/3642; G01R 33/5659
See application file for complete search history.

(56) References Cited

U.S. PATENT DOCUMENTS

| | | | |
|---|---|---|---|
| 10,732,237 B2* | 8/2020 | Slobozhanyuk | G01R 33/36 |
| 2010/0039111 A1* | 2/2010 | Luekeke | H01Q 21/065 |
| | | | 324/318 |
| 2011/0204891 A1* | 8/2011 | Drake | G01R 33/3415 |
| | | | 324/309 |
| 2014/0361769 A1* | 12/2014 | Hardie | G01R 33/3692 |
| | | | 324/322 |
| 2015/0260812 A1* | 9/2015 | Drake | H01Q 21/065 |
| | | | 324/318 |

(Continued)

OTHER PUBLICATIONS

The ISPN Guide to Pediatric Neurosurgery, 2020. https://ispn.guide/.

(Continued)

*Primary Examiner* — G. M. A Hyder
(74) *Attorney, Agent, or Firm* — Quarles & Brady LLP

(57) ABSTRACT

A reconfigurable metamaterial is used to enhance the reception field of a radio frequency ("RF") coil for use in magnetic resonance imaging ("MRI"). In general, the metamaterial can be a metasurface, which may be flexible, having a periodic array of resonators. Each resonator in the periodic array can be defined as a unit cell of the metamaterial and/or metasurface. The unit cells include a first conductor and a second conductor separated by an insulator layer. The first conductor can be a solid conductor and the second conductor can be a conductive fluid (e.g., a liquid metal, a liquid metal alloy) contained within a microfluidic channel. Varying the volume of conductive fluid in each unit cell adjust the signal enhancement ratio of the metamaterial.

24 Claims, 11 Drawing Sheets

(56) References Cited

U.S. PATENT DOCUMENTS

2018/0340991 A1* 11/2018 Mett ..................... G01R 33/36

OTHER PUBLICATIONS

J. Valentine, S. Zhang, T. Zentgraf, E. Ulin-Avila, D. A. Genov, G. Bartal, X. Zhang, "Three-dimensional optical metamaterial with a negative refractive index". Nature 2008, 455, 376.
D. Weishaupt, V. D. Köchli, B. Marincek, How does MRI work? An Introduction to the Physics and Function of Magnetic Resonance Imaging, Springer Science & Business Media, 2006.
P.C. Wu, W. Zhu, Z. X. Shen, P. H. J. Chong, W. Ser, D. P. Tsai, A.-Q. Liu, "Broadband Wide-Angle Multifunctional Polarization Converter via Liquid-Metal-Based Metasurface". Advanced Optical Materials 2017, 5, 1600938.
N. Yu, F. Capasso, "Flat Optics with Designer". Nature Materials 2014, 13, 139.
W. Zhang, Q. Song, W. Zhu, Z. Shen, P. Chong, D. P. Tsai, C. Qiu, A. Q. Liu, "Metafluid metamaterial: a review". Advances in Physics: X 2018, 3, 1417055.
X. Zhang, Z. W. Liu, "Superlenses to overcome the diffraction limit". Nature Materials 2008, 7, 435.
X. Zhao, G. Duan, K. Wu, S. W. Anderson, X. Zhang, "Intelligent Metamaterials Based on Nonlinearity for Magnetic Resonance Imaging". Advanced Materials, 2019, 1905461.
Y. Zhao, M. A. Belkin, A. Alù, "Twisted optical metamaterials for planarized ultrathin broadband circular polarizers". Nature Communications 2012, 3, 870.
Y. Zhao, X. X. Liu, A. Alu, "Recent advances on optical metasurfaces". Journal of Optics 2014, 16.
N.I. Zheludev, Y. S. Kivshar, "From metamaterials to metadevices". Nature Materials 2012, 11, 917.
G.X. Zheng, H. Muhlenbernd, M. Kenney, G. X. Li, T. Zentgraf, S. Zhang, "Metasurface holograms reaching 80% overall efficiency". Nature Nanotechnology 2015, 10, 308.
J. Zhu, J. Christensen, J. Jung, L. Martin-Moreno, X. Yin, L. Fok, X. Zhang, F. J. Garcia-Vidal, "A holey-structured metamaterial for acoustic deep-subwavelength imaging". Nature Physics 2011, 7, 52.
W. Zhu, Q. Song, L. Yan, W. Zhang, P.-C. Wu, L. K. Chin, H. Cai, D. P. Tsai, Z. X. Shen, T. W. Deng, S. K. Ting, Y. Gu, G. Q. Lo, D. L. Kwong, Z. C. Yang, R. Huang, A.-Q. Liu, N. Zheludev, Advanced Materials 2015, 27, 4665.
F. Aieta, P. Genevet, M. A. Kats, N. F. Yu, R. Blanchard, Z. Gahurro, F. Capasso, "Aberration-Free Ultrathin Flat Lenses and Axicons at Telecom Wavelengths Based on Plasmonic Metasurfaces". Nano Lett. 2012, 12, 4932.
H. Alaeian, J. A. Dionne, "PT-Symmetric Plasmonic Metamaterials". Physical Review A 2014, 89, 033829.
A. Alù, M. G. Silveirinha, A. Salandrino, N. Engheta, "Epsilon-Near-Zero (ENZ) Metamaterials and Electromagnetic Sources: Tailoring the Radiation Phase Pattern". Physical Review B 2007, 75, 155410.
A. Barandov, B. B. Bartelle, C. G. Williamson, E. S. Loucks, S. J. Lippard, A. Jasanoff, "Sensing intracellular calcium ions using a manganese-based MRI contrast agent". Nature Communications 2019, 10, 897.
A. Boltasseva, H. A. Atwater, "Low-Loss Plasmonic Metamaterials". Science 2011, 331, 290.
R.W. Brown, Y.-C. N. Cheng, E. M. Haacke, M. R. Thompson, R. Venkatesan, Magnetic Resonance Imaging: Physical Principles and Sequence Design, Wiley-Blackwell, 2014.
D. Burk, E. Kanal, J. Brunberg, G. Johnstone, H. Swensen, G. Wolf, "1.5-T Surface-Coil MRI of the Knee". American Journal of Roentgenology 1986, 147, 293.
W. Cai, U. K. Chettiar, A. V. Kildishev, V. M. Shalaev, "Optical Cloaking with Non-Magnetic Metamaterials". Nature Photonics 2007, 1, 224.
H.T. Chen, A. J. Taylor, N. F. Yu, "A Review of Metasurfaces: Physics and Applications." Reports on Progress in Physics 2016, 79.

J.A. de Zwart, P. J. Ledden, P. Kellman, P. v. Gelderen, J. H. Duyn, "Design of a SENSE-Optimized High-Sensitivity MRI Receive Coil for Brain Imaging". Magnetic Resonance in Medicine 2002, 47, 1218.
G. Duan, X. Zhao, S. W. Anderson, X. Zhang, "Boosting magnetic resonance imaging signal-to-noise ratio using magnetic metamaterials". Commun Phys 2019, 2, 1.
J. Duyn, A. P. Koretsky, "Magnetic Resonance Imaging of Neural Circuits". Nature Clinical Practice Cardiovascular Medicine 2008, 5, S71.
N. Engheta, R. W. Ziolkowski, Metamaterials: Physics and Engineering Explorations, John Wiley & Sons, Inc., Hoboken, NJ 2006.
A.D. Falco, Y. Zhao, A. Alú, "Optical metasurfaces with robust angular response on flexible substrates". Appl. Phys. Lett. 2011, 99, 163110.
W. Fan, B. Yan, Z. Wang, L. Wu, "Three-dimensional all-dielectric metamaterial solid immersion lens for subwavelength imaging at visible frequencies". Science Advances 2016, 2, e1600901.
V. Hartwig, G. Giovannetti, N. Vanello, M. Lombardi, L. Landini, S. Simi, "Biological Effects and Safety in Magnetic Resonance Imaging: A Review." Int J Environ Res Public Health 2009, 6, 1778.
H.A. Haus, W. Huang, "Coupled-Mode Theory". Proceedings of the IEEE 1991, 79, 1505.
Q. He, S. Sun, L. Zhou, "Tunable/Reconfigurable Metasurfaces: Physics and Applications". Research 2019, 2019, 16.
O. Hess, J. B. Pendry, S. A. Maier, R. F. Oulton, J. M. Hamm, K. L. Tsakmakidis, "Active nanoplasmonic metamaterials". Nature Materials 2012, 11, 573.
C.L. Holloway, E. F. Kuester, J. A. Gordon, J. O. Hara, J. Booth, D. R. Smith, "An Overview of the Theory and Applications of Metasurfaces: The Two-Dimensional Equivalents of Metamaterials". IEEE Antennas and Propagation Magazine 2012, 54, 10.
Y. Hui, J. S. Gomez-Diaz, Z. Qian, A. Alù, M. Rinaldi, "Plasmonic piezoelectric nanomechanical resonator for spectrally selective infrared sensing". Nature Communications 2016, 7, 11249.
A. Hurshkainen, A. Nikulin, E. Georget, B. Larrat, D. Berrahou, A. L. Neves, P. Sabouroux, S. Enoch, I. Melchakova, P. Belov, S. Glybovski, R. Abdeddaim, "A Novel Metamaterial-Inspired RF-coil for Preclinical Dual-Nuclei MRI". Sci Rep 2018, 8, 1.
Z. Jacob, L. V. Alekseyev, E. Narimanov, "Optical Hyperlens: Far-field imaging beyond the diffraction limit". Opt. Express, OE 2006, 14, 8247.
M. Khorasaninejad, F. Capasso, "Metalenses: Versatile multifunctional photonic components". Science 2017, 358, eaam8100.
A.V. Kildishev, A. Boltasseva, V. M. Shalaev, "Planar Photonics with Metasurfaces". Science 2013, 339.
E.I. Kretov, A. V. Shchelokova, A. P. Slobozhanyuk, "Control of the magnetic near-field pattern inside MRI machine with tunable metasurface". Appl. Phys. Lett. 2019, 115, 061604.
A. Kurs, A. Karalis, R. Moffatt, J. D. Joannopoulos, P. Fisher, M. Soljačić, "Wireless Power Transfer via Strongly Coupled Magnetic Resonance". Science 2007, 317, 83.
S. Linden, C. Enkrich, M. Wegener, J. Zhou, T. Koschny, C. M. Soukoulis, "Magnetic Response of Metamaterials at 100 Terahertz". Science 2004, 306, 1351.
N. Liu, H. Guo, L. Fu, S. Kaiser, H. Schweizer, H. Giessen, "Three-dimensional photonic metamaterials at optical frequencies". Nature Materials 2008, 7, 31.
B. Luk'yanchuk, N. I. Zheludev, S. A. Maier, N. J. Halas, P. Nordlander, H. Giessen, C. T. Chong, "The Fano resonance in plasmonic nanostructures and metamaterials". Nature Materials 2010, 9, 707.
N. Mohammadi Estakhri, B. Edwards, N. Engheta, "Inverse-designed metastructures that solve equations". Science 2019, 363, 1333.
N. Münzenrieder, L. Petti, C. Zysset, T. Kinkeldei, G. A. Salvatore, G. Tröster, "Flexible Self-Aligned Amorphous InGaZnO Thin-Film Transistors With Submicrometer Channel Length and a Transit Frequency of 135 MHz". IEEE Transactions on Electron Devices 2013, 60, 2815.
D.G. Nishimura, principles of magnetic resonance imaging, Stanford University, 2010.
A. Nowogrodzki, "The Strongest Scanners". Nature 2018, 563, 24.

(56) References Cited

OTHER PUBLICATIONS

S. Ogawa, S., T. M. Lee, A. R. Kay, D. W. Tank, "Brain magnetic resonance imaging with contrast dependent on blood oxygenation." Proceedings of the National Academy of Sciences 1990, 87, 9868.

J.B. Pendry, D. Schurig, D. R. Smith, "Controlling Electromagnetic Fields". Science 2006, 312, 1780.

N. Petridou, D. Plenz, A. C. Silva, M. Loew, J. Bodurka, P. A. Bandettini, "Direct magnetic resonance detection of neuronal electrical activity". Proceedings of the National Academy of Sciences 2006, 103, 16015.

A. Poddubny, I. Iorsh, P. Belov, Y. Kivshar, "Hyperbolic metamaterials". Nature Photonics 2013, 7, 948.

F. Schenck, A. Hart, H. Foster, A. Edelstein, A. Bottomley, W. Redington, "Improved MR Imaging of the Orbit at 1.5 T with Surface Coils". 1985, 4.

V.D. Schepkin, F. C. Bejarano, T. Morgan, S. Gower-Winter, M. Ozambela Jr., C. W. Levenson, "In Vivo Magnetic Resonance Imaging of Sodium and Diffusion in Rat Glioma at 21.1 T". Magnetic Resonance in Medicine 2012, 67, 1159.

R. Schmidt, A. Slobozhanyuk, P. Belov, A. Webb, "Flexible and compact hybrid metasurfaces for enhanced ultra high field in vivo magnetic resonance imaging". Sci Rep 2017, 7, 1678.

R. Schmidt, A. Webb, "Metamaterial Combining Electric- and Magnetic-Dipole-Based Configurations for Unique Dual-Band Signal Enhancement in Ultrahigh-Field Magnetic Resonance Imaging" ACS Appl. Mater. Interfaces 2017, 9, 34618.

A.V. Shchelokova, A. P. Slobozhanyuk, S. Saha, I. Sotiriou, M. Koutsoupidou, G. Palikaras, E. Kallos, P. A. Belov, A. Webb, "In vivo magnetic resonance imaging of human knee with metasurface", presented at 2017 Progress In Electromagnetics Research Symposium—Spring (PIERS), May 2017//, 2017.

R.A. Shelby, D. R. Smith, S. Schultz, "Experimental Verification of a Negative Index of Refraction". Science 2001, 292, 77.

A.P. Slobozhanyuk, A. N. Poddubny, A. J. E. Raaijmakers, C. A. T. v. d. Berg, A. V. Kozachenko, I. A. Dubrovina, I. V. Melchakova, Y. S. Kivshar, P. A. Belov, "Enhancement of magnetic resonance imaging with metasurfaces". Advanced Materials 2016, 28, 1832.

I.I. Smolyaninov, Y. J. Hung, C. C. Davis, "Magnifying Superlens in the Visible Frequency Range". Science 2007, 315, 1699.

C.M. Soukoulis, M. Wegener, "Past Achievements and Future Challenges in 3D Photonic Metamaterials". Nature Photonics 2011, 5, 523.

C.M. Soukoulis, S. Linden, M. Wegener, "Negative Refractive Index at Optical Wavelengths". Science 2007, 315, 47.

\* cited by examiner

ULTRATHIN RECONFIGURABLE METAMATERIAL FOR SIGNAL ENHANCEMENT OF MAGNETIC RESONANCE IMAGING

CROSS-REFERENCE TO RELATED APPLICATIONS

This application claims the benefit of U.S. Provisional Patent Application Ser. No. 63/130,600, filed on Dec. 24, 2020, and entitled "ULTRATHIN RECONFIGURABLE METASURFACE FOR SIGNAL ENHANCEMENT OF MAGNETIC RESONANCE IMAGING," which is herein incorporated by reference in its entirety.

BACKGROUND

Magnetic resonance imaging ("MRI") has been widely used in staging tumors, imaging musculoskeletal systems, and monitoring brain functions. In MRI, the contrast among different types of tissue originates from the different decay rates of precession of nucleus spins. The typical resolution of MRI is in micrometers, and the scanning time is about tens of minutes; both the resolution and the scanning time depend heavily on the signal-to-noise ratio ("SNR") of the imaging area. Therefore, the SNR has been a critical parameter associated with the imaging quality of MRI.

Because the static magnetic field ($B_0$) of an MRI system governs the magnetization of the nucleus spins, the magnetic resonance signal increases with a stronger $B_0$ field intensity. The noises of MRI include Johnson noise of the imaging subject, Larmor frequency shift due to subject-receiving coil induction, resistive noise of the receiving coil, and circuit noise of the pre-amplifier. The major source of noises is Johnson noise caused by the Brownian motion of the electrons, which does not increase with the $B_0$ field intensity. As a result, when the $B_0$ field increases from 3T to 7T, as an example, the SNR can be enhanced by approximately 5.4 times. However, the safety of a strong magnetization on biological subjects remains unclear, and the financial cost to generate such a strong magnetic field is also substantial.

Another approach to enhancing SNR in MRI is to increase the oscillating $B_1$ field emitted and/or received by the receiving radio frequency ("RF") coil. Different surface coils have been designed for various imaging targets such as eyes, knees, and heads. While a specific designed surface coil can improve the SNR by 2.7-5 fold, it needs to be re-designed for different organs due to the constraints in shapes and rigidity; once developed, a given surface it does not provide the flexibility to image the specific region-of-interest within the imaging target.

Recent research has shown promise of applying the concept of metamaterials in MRI to further enhance the SNR without modifying the imaging system. Metamaterials are sub-wavelength periodic structures that can achieve anomalous field effects that are not available in natural materials. Because of the advantages of independently controlling the localized fields, metamaterials have been applied to boost or reshape electromagnetic fields in imaging applications. As an example, a metamaterial composed of an array of copper-wires has been shown to enhance the SNR of MRI by 2.7 times, and as another example a metamaterial with spiral arrays has been shown to enhance the SNR by 4.2 times. However, the non-uniformity of the RF excitation field caused by metamaterials remains a technical challenge to their use in MRI.

To enhance the signals at the receiving coil, while preserving the uniformity of the excitation field, metamaterials with nonlinearities have been developed to tune the resonance frequencies, so the metamaterial can be switched on/off during the reception/excitation. The nonlinear metamaterial can enhance SNR up to 15.9 times without interrupting the excitation, but requires a thickness over 5 cm, which creates challenges to fit the metamaterial in the limited space between the patient and the receiving coil. Furthermore, enhancing the SNR based on this concept is limited because the energy is distributed in a large region.

SUMMARY OF THE DISCLOSURE

The present disclosure addresses the aforementioned drawbacks by providing a metamaterial for enhancing the reception field of a radio frequency ("RF") receiving coil for use with a magnetic resonance imaging ("MRI") system. The metamaterial includes a periodic array of resonators, with each resonator in the periodic array of resonators defining a unit cell of the metamaterial. Each unit cell includes a substrate composed of an insulator, a first conductor arranged on one side of the substrate, and a second conductor arranged on an opposite side of the substrate. The second conductor includes a microfluidic channel containing a conductive fluid. By varying the volume of the conductive fluid in the second conductor of each unit cell, the reactance distribution of the periodic array of resonators can be adjusted.

The foregoing and other aspects and advantages of the present disclosure will appear from the following description. In the description, reference is made to the accompanying drawings that form a part hereof, and in which there is shown by way of illustration one or more embodiments. These embodiments do not necessarily represent the full scope of the invention, however, and reference is therefore made to the claims and herein for interpreting the scope of the invention.

BRIEF DESCRIPTION OF THE DRAWINGS

FIG. 1A shows an example metamaterial composed of a periodic array of unit cells, and FIG. 1B shows a cross-section through a portion of the metamaterial, showing a three-layered structure of the example metamaterial.

FIG. 8A shows a magnetic field distribution with all 21×21 unit cells of an example metasurface that are turned "off" to provide a uniform excitation. All θ are tuned to 20° so Im[Γ] at 127 MHz (i.e., the Larmor frequency for hydrogen nuclei at a magnetic field strength of 3 T) is −29.3. The feeding field is linearly polarized uniform magnetic field with the field direction vertical to the metasurface plane. $B_1^+$ and $B_{1m}^+$ are the excitation field with and without the metasurface. FIG. 8B shows the excitation field in the horizontal cross-section at 1 cm above the metasurface, and FIG. 8C shows the excitation field in the vertical cross-section.

FIG. 9A shows a target magnetic field with enhancement region of a brain tumor. $B_1^-$ and $B_{1m}^-$ are the reception field with and without the metasurface. Both $B_1^-$ and $B_{1m}^-$ are linearly polarized along the z-direction. FIG. 9B sows a calculated Im[Γ] distribution, where all Im[Γ] exceed 2.94 are set as 2.94. FIGS. 9C and 9D show a horizontal section of the overall magnetic field at 1 cm (FIG. 9C) and 2 cm (FIG. 9D) above the metasurface.

FIGS. 10A-10C show the distribution of a Gaussian field with field-width of 4 cm, 4 cm and 8 cm and central location of (0 cm, 0 cm), (4 cm, 0 cm), and (0 cm, 0 cm), respectively. FIGS. 10D-10F show the vertical cross-section (x-z plane) of the magnetic field with 1 cm above the metasurface corresponding to FIGS. 10A-10C. The blue curves represent the enhancement ratio at z=1 cm. FIG. 10G shows the enhancement ratio at the focal point as a function of z for 2 cm-, 4 cm-, 8 cm- and 12 cm-FWHM Gaussian field. The insets show x-y cross section at 2.5 cm above the metasurface of the four Gaussian field respectively.

FIGS. 11A-11C show schematic illustrations of metasurfaces with different curvature: planar (FIG. 11A), half-cylindrical (FIG. 11B), and cylindrical (FIG. 11C). The B1− field is circularly polarized (left handed) with the field vector rotating on the yz-plane. The targeted eigenmode is designed as a letter "I" shape. The observation plane is at 1 cm above the metasurface. FIGS. 11D-11F shows the corresponding reactance distribution that will generate the target eigenmodes. FIGS. 11G-11I show the field distribution on the observation plane.

DETAILED DESCRIPTION

Figure 1A:
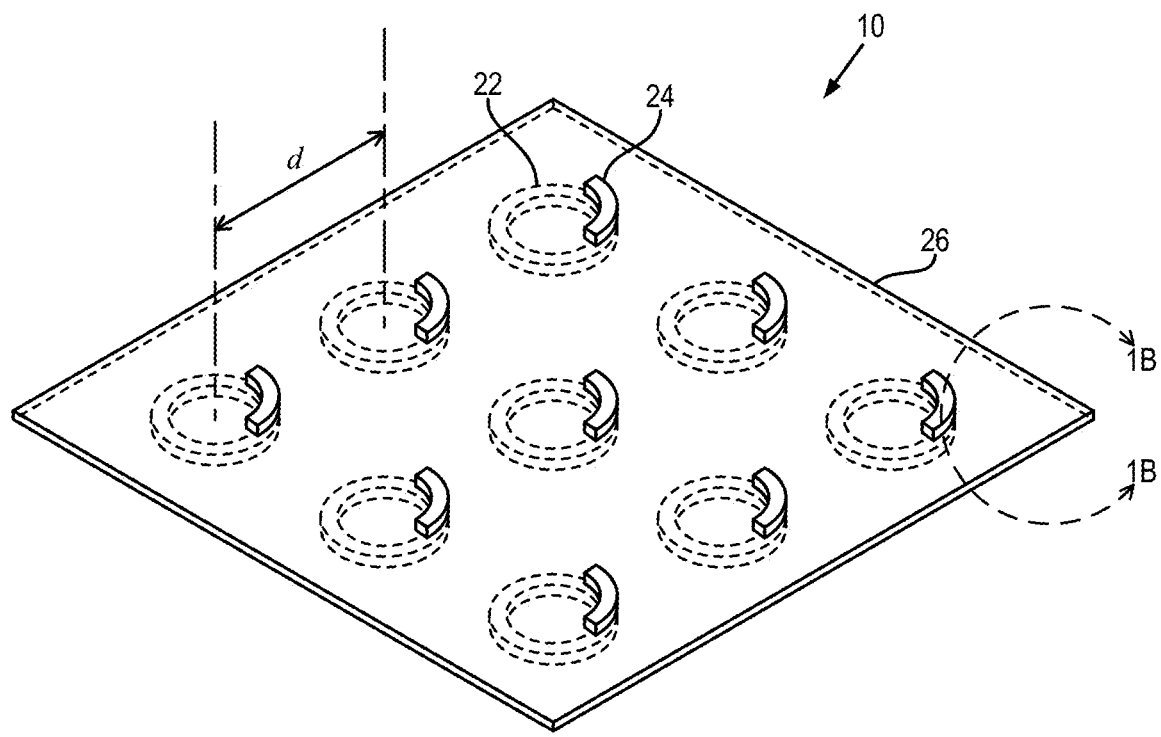
FIGS. 1A and 1B show an example metamaterial capable of reconfigurably enhancing signal reception in magnetic resonance imaging ("MRI").

Described here are metamaterials configured to enhance the reception field of a radio frequency ("RF") coil for use in magnetic resonance imaging ("MRI"). In general, the metamaterials can be configured as a metasurface having a periodic array of resonators. In some embodiments, the metamaterials can be configured as a flexible metasurface. Each resonator in the periodic array can be define as a unit cell of the metamaterial and/or metasurface. The unit cells include a first conductor and a second conductor separated by an insulator layer. The first conductor can be a solid conductor and the second conductor can be a conductive fluid (e.g., a liquid metal, a liquid metal alloy) contained within a microfluidic channel.

The signal-to-noise ratio ("SNR") is the main figure-of-merit that assesses the quality of MRI. Existing studies mainly focus on improving the magnetic field intensities of the constant homogenous $B_0$ field from the main magnet coil of an MRI system or the oscillating $B_1$ field from the RF coil. In addition to these options, SNR also depends on the coupling between the imaging subject and the RF coil during the signal reception. Embodiments of the present disclosure include a different route towards enhancing the SNR of MRI by improving the coupling between the imaging subject and the RF coil during the signal reception.

In certain embodiments, a metamaterial can be configured as an ultrathin metasurface with micrometer thickness and high flexibility is provided. The metasurface may be reconfigurable, such that it can selectively boost the SNR at a desired imaging region with any arbitrary shapes. As a non-limiting example, in some configurations the metasurface(s) described in the present disclosure can enhance SNR by up to 28 times in the region-of-interest. In certain embodiments, at the same time, the metasurface(s) can be configured to minimally disturb the excitation fields (e.g., by less than 1.6%), thereby maintaining the uniformity of the excitation, which is advantageous for achieving a high-quality MR image without artifacts.

One or more embodiments of the present disclosure fill the gap between a whole-body MRI system and the single-purpose MRI system (e.g., a dedicated head-MRI system). Using the metamaterial(s) described in the present disclosure, a whole-body MRI system can generate images with similar or even better quality than the single-purpose MRI system. In certain embodiments, the metamaterial may be easy-to-use (without any modification required for the MRI system) and has much lower cost than the single-purpose MRI systems. This advantage may be particularly beneficial for hospitals in developing countries that have limited resources of MRI. In certain embodiments, on the other hand, the metamaterial(s) can target on specific regions to generate an image with better quality. In certain embodiments, this can be used for imaging small objects, such as early-stage brain tumors.

The metamaterials described in the present disclosure overcome the drawbacks of previous metamaterials used to enhance SNR in MRI. As generally described above, the present disclosure provides metamaterials that, in some embodiments, can be configured as an ultrathin dynamically reconfigurable metasurface. Although resonance tuning is also feasible with the metamaterial/metasurface designs described in the present disclosure, it is an advantage that the disclosed metamaterials do not require resonance tuning to provide enhancement of the RF reception field. Instead, the metamaterials are configured to allow for reforming the eigenmodes of the metamaterial/metasurface for an on-demand enhancement region. As a non-limiting example, a 28-fold enhancement of the SNR can be achieved in a user-defined area using the metamaterials described in the present disclosure, simultaneously overcoming the limitation of the spatial constraints with an ultrathin profile in micrometers.

In MRI, the RF coil generates an oscillating magnetic field ($B_1$) to excite the nuclear spin (e.g., proton spin), and the decay is captured by the receiving, or reception, coil. Here, $B_1^+$ and $B_1^-$ can be used to represent the excitation signal and the reception signal, respectively. Because metamaterials are oftentimes made of high-index dielectric materials or metal, they can locally enhance the electromagnetic fields, but at the same time will also create phase disruptions. The phase disruptions are not desired during RF excitation, because they will create a non-uniform, three-dimensional magnetic resonance image as well as complicate the image reconstruction.

To avoid phase disruptions during RF excitation, the metamaterials described in the present disclosure are capable of having their eigenmodes reconfigured during RF reception for an on-demand enhancement region so as to specifically enhance the $B_1^-$ field without influencing the $B_1^+$ field to ensure a uniform and optimal excitation. As a result, the receiving coil can measure a stronger decay-signal and thus achieve an improved SNR in the resulting image. With the contribution of the metamaterial, the excitation $B_1^+$ field becomes $B_{1m}^+$ and the reception $B_1^-$ field becomes $B_{1m}^-$, which includes both the original field and the scattered field from the metamaterial.

Embodiments of the present disclosure achieve a high enhancement ratio of the SNR, defined as $B_{1m}^-/B_1^-$, while at the same time keeping $B_{1m}^+/B_1+$ as close to 1 as possible. To shape a user-defined distribution of the $B_{1m}^-$ field, the eigenmode of the metamaterial can be tailored. The eigenmode is described by the normalized distribution of, $$a_n = \sqrt{\frac{\hat{L}}{2}} I_n e^{i\omega_0 t}$$

where $\hat{L}$ and $I_n$ are the self-inductance and current of each unit cell of the metamaterial, respectively, and $\omega_0$ is the angular frequency of the $B_1^+$ and $B_1^-$ field. The self-inductance, $\hat{L}$ is normalized as 1 H. Although the signal detected by the receiving coil ($B_1^-$) is generated by the subject being imaged, based on the principle of reciprocity, the same field $B_1^-$ can be generated by the receiving coil with a unit current at a specific location of the imaging subject. This concept is used to design the metamaterial(s) described in the present disclosure.

In general, the metamaterial(s) described in the present disclosure are composed of periodic arrays of resonators with significant mutual coupling among the neighboring unit cells. According to the coupled mode theory, $\alpha_n$ is related to the coupling among the unit cells ($\kappa_{kn}$) of the metamaterial, the intrinsic loss ($\Gamma_n$) and the driving force ($F_n(t)$) of each unit cell:

$$\frac{da_n(t)}{dt} = (i\omega_0 - \Gamma_n)a_n(t) + i\sum_{k=1}^{m}\kappa_{kn}a_k(t) + F_n(t); \quad (1)$$

where m is the total number of the unit cells of the metamaterial. The intrinsic loss, $\Gamma_n$, is directly associated with the impedance, $Z_n$, of each unit cell as, $$\Gamma_n = \frac{Z_n}{2\hat{L}}.$$

The coupling coefficient between the kth and nth unit cell is $\kappa_{kn}$. The driving force, $F_n(t)$, excites the eigenmodes of the metamaterial but doesn't define the eigenmodes; therefore, in some embodiments this term does not need to be accounted for when designing the metamaterial(s). By expanding Equation (1), the relation among the intrinsic loss ($\Gamma_n$), the coupling coefficient $\kappa_{kn}$, and the targeting eigenmode $\alpha_{nt}$ can be deduced:

$$\Gamma_n = \frac{i\sum_{k=1}^{m}\kappa_{kn}a_{kt}}{a_{nt}}. \quad (2)$$

To shape the eigenmode, one can either tune the coupling coefficients $\kappa C_{kn}$ or the intrinsic loss $\Gamma_n$ of each unit cell. Because $\kappa_{kn}$ depends on the relative positions of the unit cells, changing the position of one unit cell will alter its relative position to the rest of the unit cells. Therefore, $\kappa_{kn}$ cannot be readily controlled independently. On the other hand, $\Gamma_n$ is only related to the impedance of each unit cell and, therefore, can be readily controlled independently.

In the metamaterial designs described in the present disclosure, the coupling coefficient $\kappa_{kn}$ (i.e., the periodicity of the metamaterial) can be fixed, and the intrinsic loss, $\Gamma_n$, can be tuned to achieve the desired eigenmode. The real part of the intrinsic loss, Re[$\Gamma$], represents the intrinsic resistive loss of the unit cell that leads to attenuation of the $B_{1m}^-$ field, therefore, lossless/low-loss materials at the operation frequency should be employed for constructing the metamaterial to minimize heating. The imaginary part of the intrinsic loss, Im[$\Gamma$], comes from the capacitance and inductance of each unit cell constituting the metamaterial, with the capacitance being the dominant variable at the given frequency. Therefore, the capacitance can be a tunable variable in the metamaterial designs described in the present disclosure.

Figure 1B:
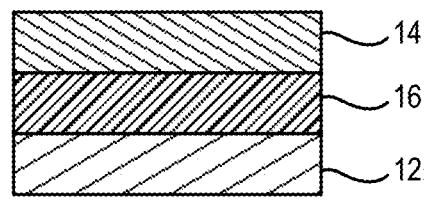

Referring now to FIGS. 1A and 1B, an example metamaterial 10, which can be used to form a metasurface, in accordance with some embodiments described in the present disclosure is shown. Additionally or alternatively, the metamaterial 10 can also be configured in different geometries than a metasurface. For example, the metamaterial 10 may in some embodiments be configured with a three-dimensional geometry. The metamaterial 10 generally includes a periodic array of resonators that each define a unit cell 20 of the metamaterial 10. In general, the metamaterial includes a first conductive layer 12, a second conductive layer 14, and an insulator layer 16 arranged between the first conductive layer 12 and the second conductive layer 16. In some embodiments, the insulator layer 16 may be composed of a flexible material, such that it is a flexible insulator layer. In these instances, the metamaterial 10 may be a flexible metamaterial.

The first conductive layer 12 can include a plurality of conductive elements, such as solid conductor loops. Likewise, the second conductive layer 14 can also include a plurality of conductive elements. In the second conductive layer 14, the conductive elements are preferably constructed as a plurality of microfluidic channels that are partially or fully filled with a conductive fluid, such as a liquid metal or a liquid metal alloy. By varying the volume of conductive fluid in the microfluidic channels, the capacitance of the metamaterial 10 can be tuned, thereby adjusting the eigenmode of the metamaterial 10, as described above.

The insulator layer 16 is preferably composed of a flexible material, such that the metamaterial 10 can be bent or shaped into various surfaces or shapes. Advantageously, this flexibility allows for the metamaterial 10 to conform to patient anatomy, a particular RF coil geometry, or the like.

The conductive elements in the first conductive layer 12 and the second conductive layer 14 are generally paired, with each pair of conductive elements and the portion of the insulator layer 16 arranged therebetween defining a unit cell 20 of the metamaterial 10. As shown in FIG. 1, the unit cells 20 of the metamaterial 10 are arranged in a periodic array. For example, the unit cells 20 can have an in-plane periodicity of d. In the illustrated embodiment, the metamaterial 10 is configured as a reconfigurable metamaterial and/or metasurface composed of 3×3 unit cells, with an in-plane periodicity, d=1 cm, and where $\kappa_{01}$ indicates the coupling coefficient between the zeroth and first unit cells.

An example unit cell 20 of the metamaterial 10 is shown in FIGS. 2, 3, 4A, and 4B. Each unit cell 20 of the metamaterial 10 generally includes a first conductor 22 (i.e., the conductive element of the first conductive layer 12), a second conductor 24 (i.e., the conductive element of the second conductive layer 14), and a substrate 26 arranged between the first conductor 22 and the second conductor 24 (i.e., the portion of the insulator layer 16 spanning the unit cell 20). In some embodiments, the substrate 26 is composed of a flexible material such that the substrate 26 it is a flexible substrate. In the illustrated embodiment, the first conductor 22 is on one side of the substrate 26, and the second conductor 24 is on another side of the substrate 26. For example, the first conductor 22 can be arranged on or otherwise coupled to a first surface of the substrate 26, and the second conductor 24 can be arranged on or otherwise coupled to a second surface of the substrate 26.

Figure 2:
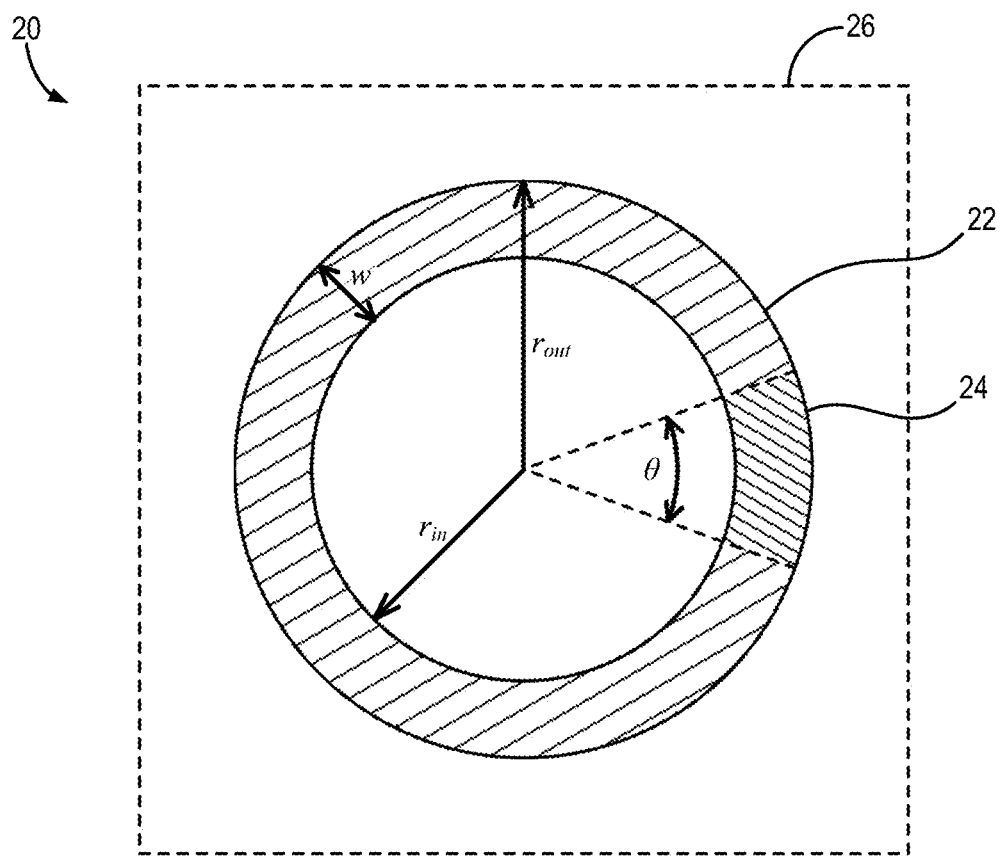
FIG. 2 shows an example unit cell of a metamaterial in accordance with some embodiments described in the present disclosure.
Figure 3:
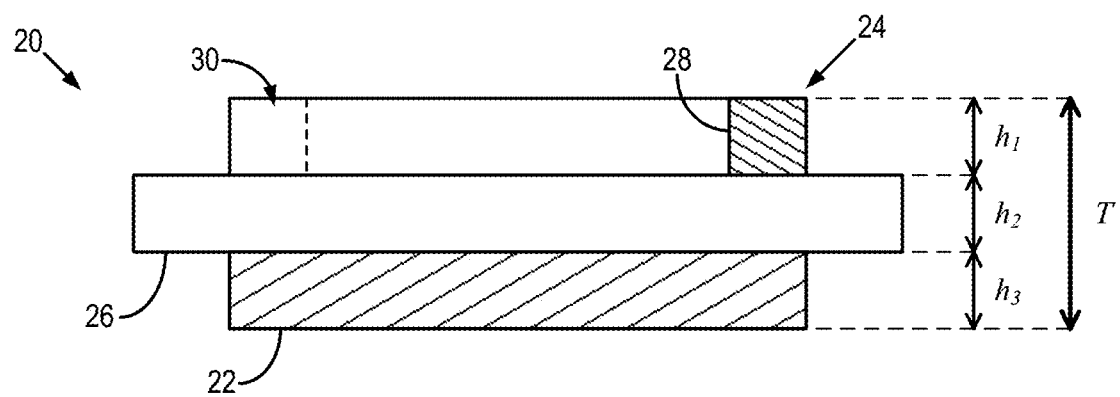
FIG. 3 shows an example cross section of the unit cell shown in FIG. 2.

The first conductor 22 in each unit cell 20 is preferably composed of a solid conductive material. For example, the first conductor 22 can be composed of copper, or another suitable solid conductive material. In the illustrated embodiment, the first conductor 22 has an annular ring shape defined by an inner radius, $r_{in}$, an outer radius $r_{out}$, and a width, w, as shown in FIG. 2. The thickness, $h_3$, of the first conductor 22 can be between 1 μm and 2 μm. For example, the thickness, $h_3$, of the first conductor 22 can be 1.2 μm. More generally, the thickness, $h_3$, of the first conductor 22 can be selected such that the resistance of the first conductor 22, which in some embodiments is configured as a ring resonator, is comparably small to its reactance.

The second conductor 24 in each unit cell is composed of a conductive fluid 28 contained within a microfluidic channel 30 or other suitable channel, recession, aperture, container, or the like. In the illustrated embodiment, the microfluidic channel 30 is a circular channel. The circular channel can be defined by an inner radius, $r_{in}$, an outer radius $r_{out}$, and a width, w. The thickness, $h_1$, of the second conductor 24 can be between 400 μm and 600 μm. For example, the thickness, $h_1$, of the second conductor 24 can be 500 μm. More generally, the thickness, $h_1$, of the second conductor 24 can be selected based on the depth (or thickness) of a microfluidic channel in which the second conductor 24 is contained. The depth and/or thickness of the microfluidic channel (e.g., microfluidic channel 30) can be within a range that sufficiently allows for the conductive fluid 28 to be injected or otherwise introduced into the microfluidic channel.

In some embodiments, the circular channel includes a full circular channel. Alternatively, the circular channel can include a circular sector defined by an arc angle less than 360 degrees. For example, in some embodiments the circular channel can include a half-circle sector defined by an arc angle of 180 degrees.

The conductive fluid 28 may be a liquid metal, a liquid metal alloy, or other fluid with suitable electrically conductive properties. As one example, the conductive fluid 28 can be a liquid metal, such as mercury. As another example, the conductive fluid 28 can be a liquid metal alloy, which in some instances may be a eutectic alloy. For instance, the conductive fluid 28 can be a eutectic gallium-indium alloy.

Varying the volume of the conductive fluid 28 in each unit cell 20 can control the overall capacitance of the metamaterial 10, which can in turn adjust the eigenmode of the metamaterial 10. As will be described in more detail below, varying the volume of a conductive fluid 28 in a circularly shaped microfluidic channel 30 can result in varying the arc angle of the circular sector of the microfluidic channel 30 that is filled with conductive fluid 28. For example, the arc angle of the circular sector of the microfluidic channel 30 that is filled with conductive fluid 28 can be varied from about 5 degrees to about 180 degrees, or greater. As used herein, "about" means within a statistically meaningful range of a value or values such as a stated length, width, height, depth, thickness, angle, volume, concentration, molecular weight, or temperature. Such a value or range can be within an order of magnitude, typically within 20%, more typically within 10%, and even more typically within 5% of a given value or range. The allowable variation encompassed by "about" will depend upon the particular system under study, and can be readily appreciated by one of skill in the art.

Figure 12:
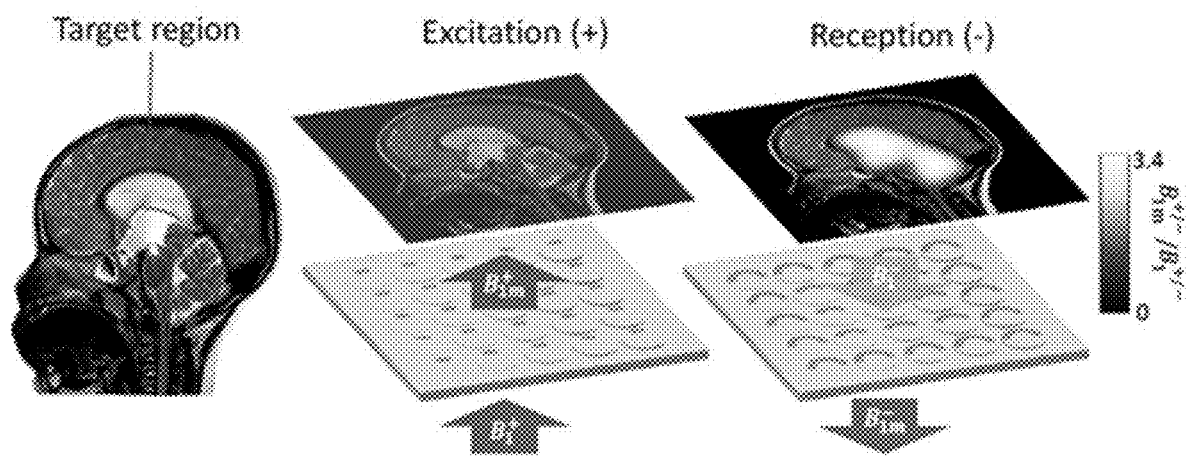
FIG. 12 shows a schematic illustration of an example use of a metasurface according to some embodiments described in the present disclosure, together with the simulated excitation field and reception field. The enhancement region targets on a brain tumor in this example.

Moreover, by adjusting the volume of conductive fluid 28 in different unit cells 20, the signal enhancement attainable with the metamaterial 10 can be tailored over a particular spatial distribution. In this way, not only is the metamaterial 10 reconfigurable, but it can be tailored to enhance the signal reception from particular regions-of-interest, which can be advantageous for enhancing signal reception from particular anatomical regions of interest. An example of this spatially tailored enhancement ratio is shown in FIG. 12.

Figure 4A:
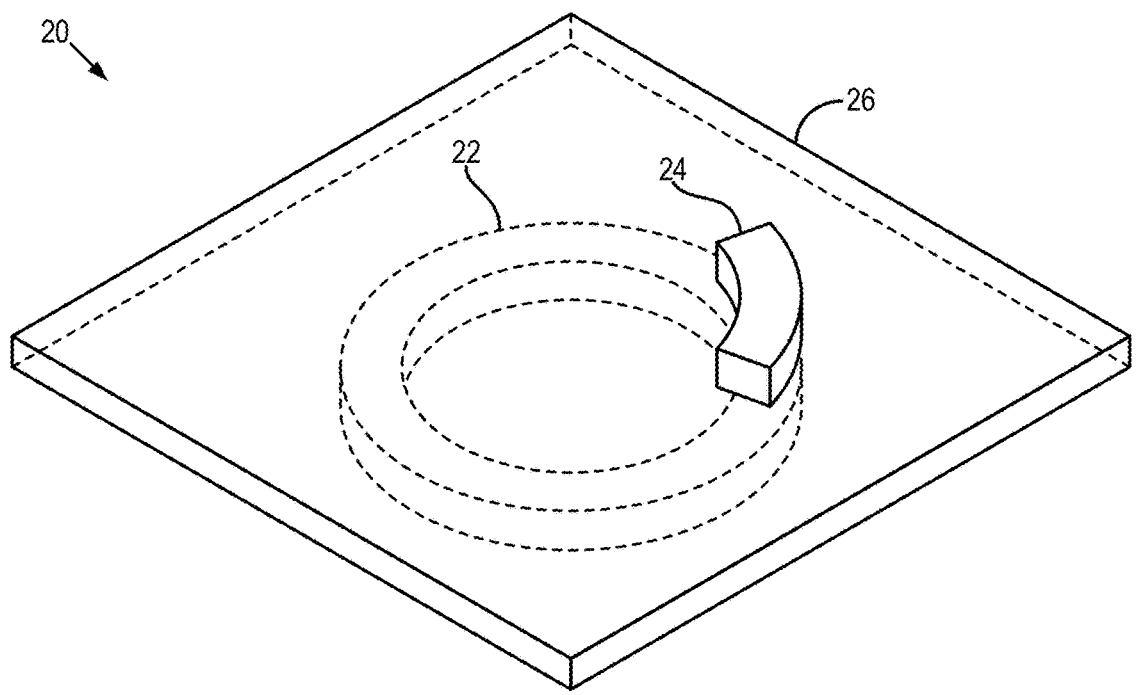
FIGS. 4A and 4B show an example unit cell in a first configuration (FIG. 4A) during which unit cell is in an "off" state such that uniform $B_1^+$ can be achieved, and a second configuration (FIG. 4B) during which the unit cell is in an "on" state such that signal reception is enhanced.
Figure 4B:
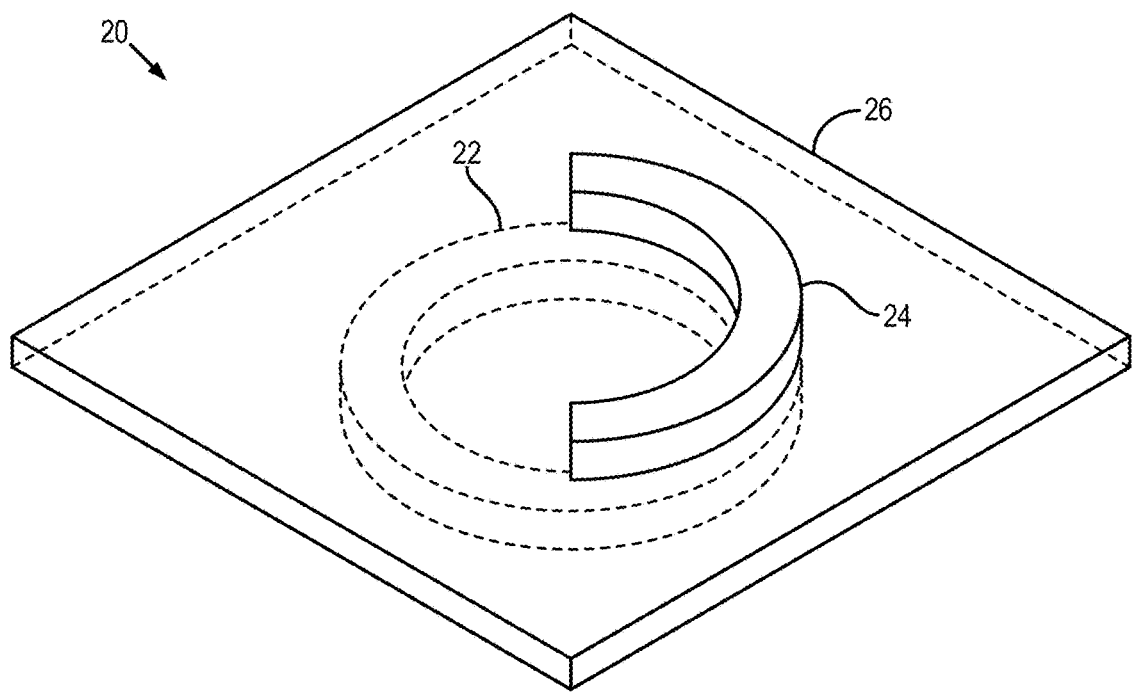

In one example, a first eigenmode of the metamaterial 10 can be defined when the arc angle, θ, of the circular sector is between 10 and 30 degrees, such as 20 degrees (e.g., as shown in FIG. 4A). As another example, a second eigenmode of the metamaterial 10 can be defined with the arc angle, θ, of the circular sector filled with conductive fluid 28 is between 170 degrees and 190 degrees, such as 180 degrees (e.g., as shown in FIG. 4B).

As shown in FIG. 1, the first conductor 22 has an annular ring shape, and the second conductor 24 is a circular channel having the same inner radius $r_{in}$, outer radius $r_{out}$, and width w as the first conductor 22. In other embodiments, the first conductor 22 and the second conductor 24 may not have the same dimensions. For example, in some instances, the first conductor 22 may have a different inner radius, outer radius, and/or width than the second conductor 24. Adjusting the degree of overlap between the first conductor 22 and the second conductor 24 will adjust their overlap area, which can tune the capacitance of the metamaterial 10. Additionally, in the illustrated embodiment, the first conductor 22 and the second conductor 24 are concentric. In other embodiments, the first conductor 22 and the second conductor 24 in each unit cell 20 may be partially offset from each other.

As described above, the substrate 26 is composed of an insulator. For example, the substrate 26 can be composed of an electrically insulating material, such as aluminum oxide ($Al_2O_3$). The thickness, $h_2$, of the substrate 26 can be between 0.8 µm and 1.2 µm. For example, the thickness, $h_2$, of the substrate 26 can be 1 µm. More generally, the thickness, $h_s$, of the substrate 26 can be selected based on the desired capacitance. For example, the capacitance between two conductive layers can be determined by the thickness of the dielectric layer (i.e., the substrate 26) as, $$C = \frac{\varepsilon_0 \varepsilon_r s}{h_2},$$

where s is the intersection area between the first conductor 22 and the second conductor 24, and $\varepsilon_r$ is the dielectric constant of the insulating material used for the substrate 26. The capacitance, C, can be selected based on the magnetic resonance frequency, or frequencies, (e.g., the Larmor frequencies of nuclear spins) that are expected to be used during magnetic resonance imaging. For example, if the metamaterial 10 is configured for use with imaging hydrogen nuclei at a magnetic field strength of $B_0$=3T, then the capacitance can be selected based on the Larmor frequency of 127 MHz. As can be seen, selecting the thickness, $h_2$, of the substrate 26 is one variable that can be changed to adjust the capacitance of the metamaterial 10. The overlap area (i.e., the intersection area, s) of the first and second conductors 22, 24 can also be adjusted. In general, the thickness, $h_2$, of the substrate 26 can be selected based on a range of potential capacitance values to which the metamaterial 10 can be tuned.

In the illustrated embodiment, a single continuous substrate spans the entire metamaterial 10 (i.e., the insulator layer 16). In other embodiments, each unit cell 20 of the metamaterial 10 may have a physically separate substrate 26, or two or more unit cells of the metamaterial 10 may share a common substrate 26.

The substrate 26 can in some embodiments form a single continuous flat planar sheet. In other embodiments, the substrate 26 can form a curved surface. For example, the substrate 26 could be formed as a half-cylindrical shape, a full cylindrical shape, an arbitrary curved shape, or the like. Advantageously, the substrate 26 enables the metamaterial 10 to be flexed, bent, or otherwise shaped into various configurations. This enables the metamaterial 10 to conform to different patient anatomies, surface coil geometries, or the like.

As a non-limiting example, the unit cell 20 of the metamaterial 10 can be composed of an Hg—$Al_2O_3$—Cu tri-layer structure with a capacitive layer in between the Hg and Cu layers. The capacitance can be tuned by the overlap area between the top and bottom layers (i.e., the second conductive layer 14 and the first conductive layer 12, respectively). The radius, r, of the Hg and Cu rings (the second conductor 24 and the first conductor 22, respectively) can be 4 mm, the width w can be 1 mm, and the thicknesses of the layers can be $h_1$=500 µm, $h_2$=1 µm, and $h_3$=1.2 µm.

Figure 5A:
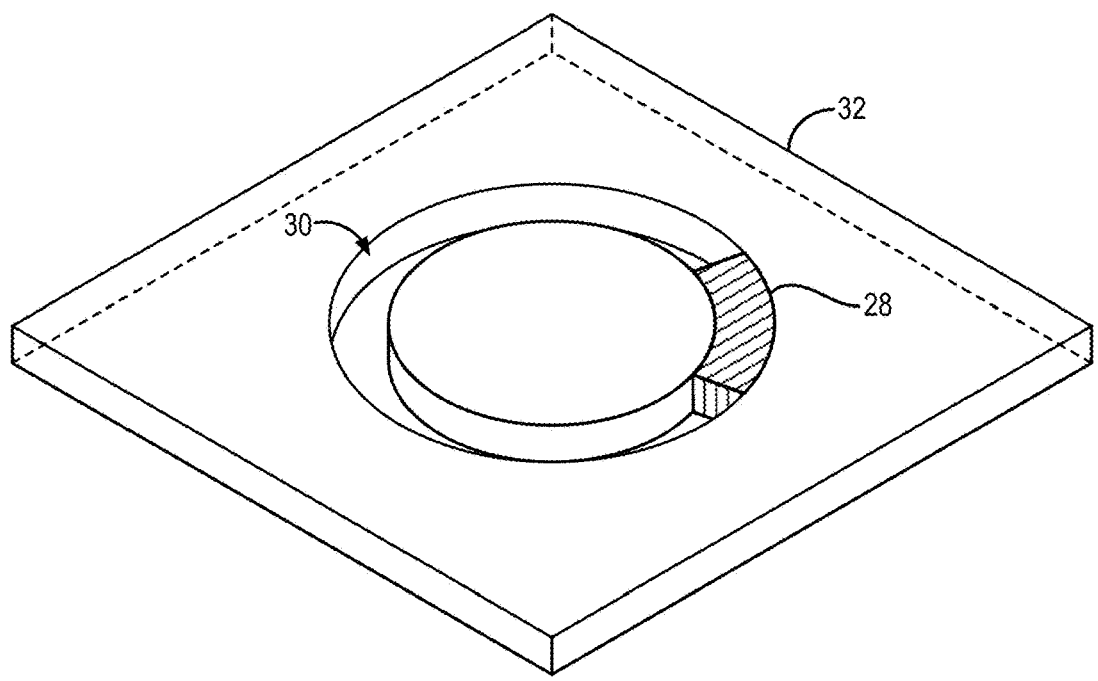
FIGS. 5A and 5B show an example second conductor of a unit cell composed of a microfluidic channel partially filled with a variable volume of conductive fluid.
Figure 5B:
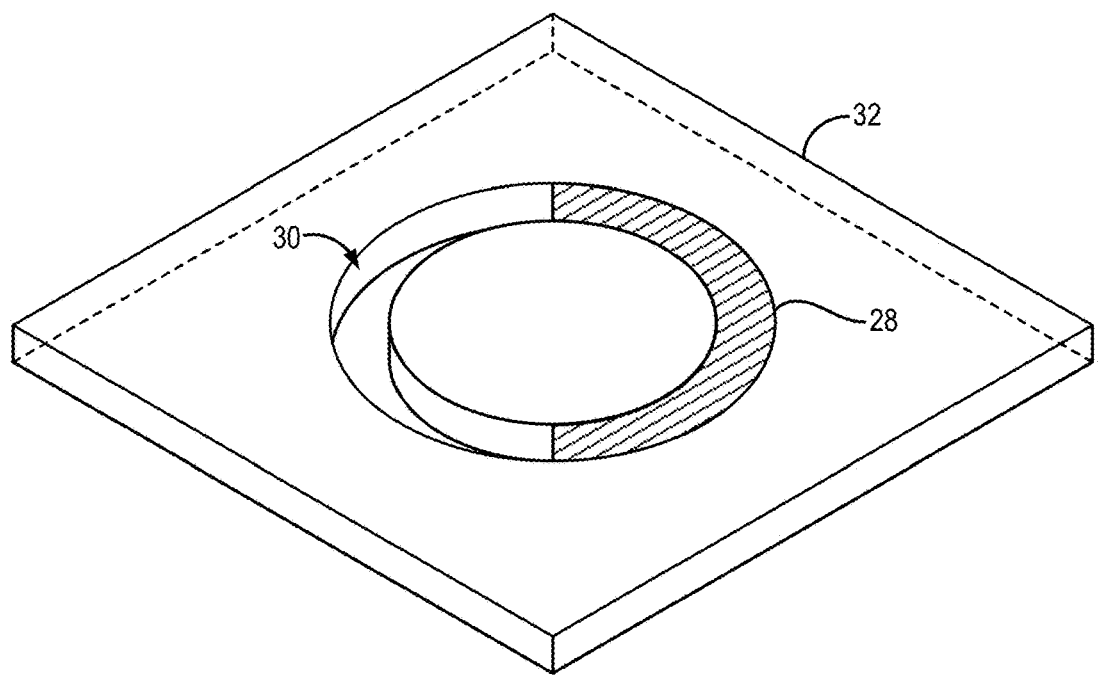

As described above, in some embodiments the conductive fluid 28 of the second conductors 24 is contained within a microfluidic channel 30. Referring now to FIGS. 5A and 5B, a non-limiting example of a microfluidic channel 30 containing the conductive fluid 28 is shown. In this example, the microfluidic channel 30 is formed in a substrate 32. As an example, the substrate 32 can be composed of a flexible material that has little to no effect on electromagnetic fields experienced by the metamaterial 10 during its use (e.g., RF fields within the frequency range used for magnetic resonance imaging). For instance, the substrate 32 can be composed of polymers, such as polydimethylsiloxane ("PDMS"), polystyrene ("PS"), polycarbonate ("PC"); glass; and/or ceramic materials. The substrate 32 can be fabricated using photolithography and/or additive manufacturing (e.g., 3D printing) techniques, or other suitable fabrication methods. In other embodiments, the microfluidic channel 30 can be constructed as microfluidic tubes (e.g., toroids, or the like).

The microfluidic channel 30 can have a circular annular shape, a circular annular sector shape, or other geometric or arbitrary shape. For example, in some embodiments the microfluidic channel 30 may be a circular annular sector shape having an arc angle of 180 degrees (i.e., half of a circular annular channel). Varying the volume of conductive fluid 28 in a microfluidic channel 30 having a circular channel (e.g., a circular annular shape, a circular annular sector shape) can include partially filling the volume of the microfluidic channel 30 with conductive fluid 28. For example, the microfluidic channel 30 can be partially filled with conductive fluid 28 such that a circular annular sector of the circular channel is filled. This circular annular sector is defined by an arc angle, θ, as shown in FIG. 2. Increasing the arc angle, θ, of the circular annular sector increases the volume of the conductive fluid 28 in the circular microfluidic channel 30. The volume of conductive fluid 28 contained within the microfluidic channel 30 can be varied by pumping conductive fluid 28 into and out of the microfluidic channel 30.

Figure 6:
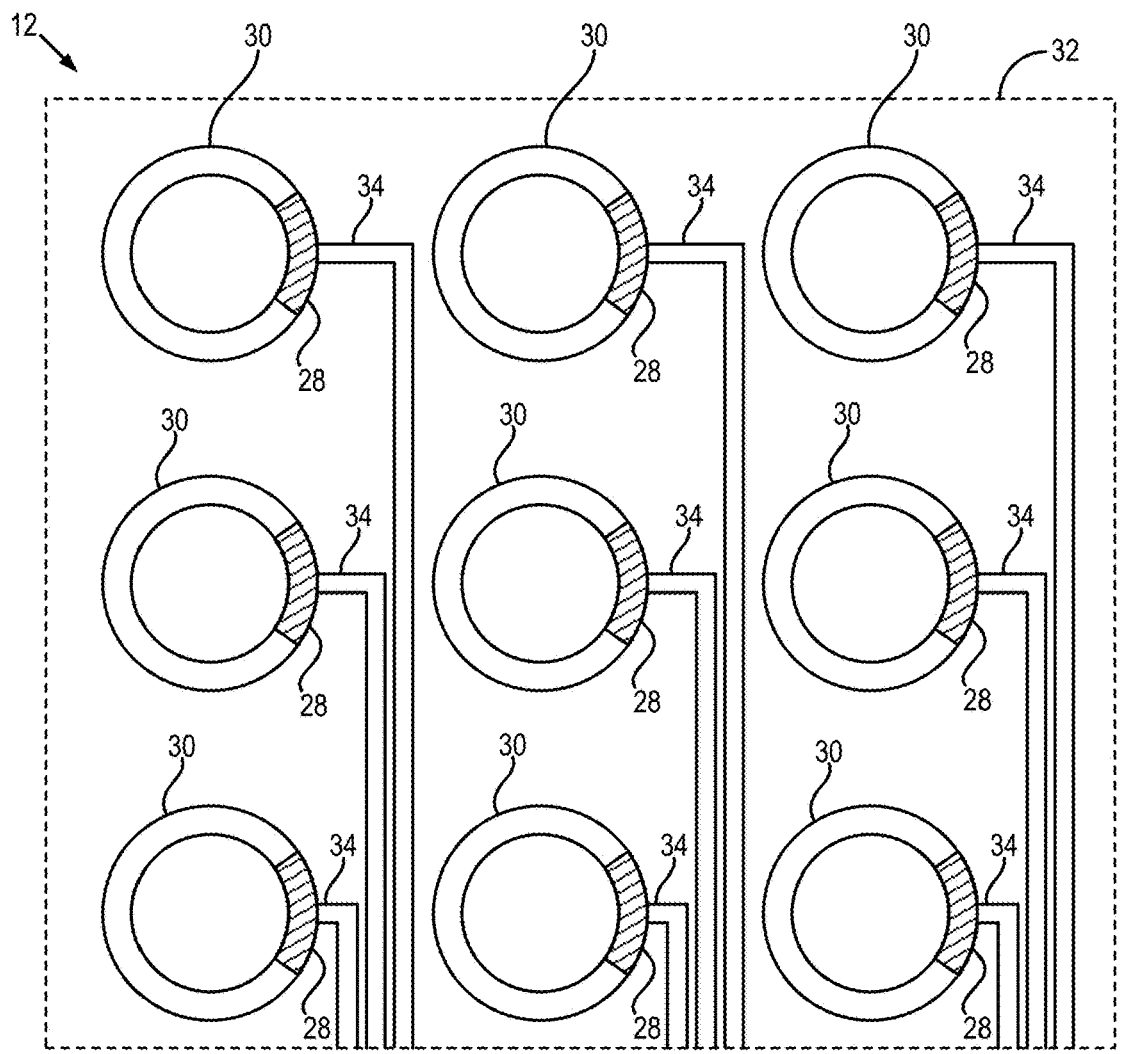
FIG. 6 shows an example second conductive layer of a metamaterial configured as a metasurface according to some embodiments described in the present disclosure, in which the second conductive layer includes a plurality of microfluidic channels partially filled with a conductive fluid, which can be pumped in and out of the microfluidic channels via inlet/outlet channels.

As shown in FIG. 6, in some embodiments each microfluidic channel 30 in the second conductive layer 14 (e.g., the microfluidic channels 30 of each unit cell 20 of the metamaterial 10) can be connected to an inlet/outlet channel 34 that can be used to independently pump conductive fluid 28 into each of the microfluidic channels 30 and/or to pump conductive fluid 28 out from the microfluidic channels 30 in order to vary the volume of the conductive fluid 28 in each second conductor 24.

A non-limiting example of a metamaterial 10 designed for use with an MRI system is illustrated similar to those shown in FIG. 1A. In this example, the metamaterial was configured as a metasurface designed to operate at 127 MHz, which corresponds to the magnetic resonance frequency of hydrogen nuclei at a magnetic field strength of 3T, which is a magnetic field strength commonly used in current clinical MRI scanners. As shown in FIG. 1B and described above, the metasurface is constructed using a metamaterial composed of a metal-insulator-metal tri-layer structure. The top layer is a microfluidic circular channel with a radius r. The channel is partially filled with a liquid metal (e.g., a eutectic gallium-indium alloy or mercury) with an arc angle θ to form a C-shaped metal layer. The additional liquid metal can be pumped in and out to change the arc angle θ, and thus tune the Im[$\Gamma_n$]. Based on the surface tension of the conductive fluid within the microfluidic channel, the volume of the conductive fluid will be constrained to a circular sector of the microfluidic channel rather than dispersing in an even layer within the channel. The spacer layer in this example is aluminum oxide ($Al_2O_3$), and the bottom layer is a fixed copper ring-resonator. The periodicity (d) of the metasurface in this example is 1 cm, the radius (r) is 4 mm, and the width (w) is 1 mm. The thickness of the top, spacer, and bottom layers of the metasurface (h1, h2, and h3) are 500 µm, 1 µm, and 1.2 µm, respectively.

Figure 7:
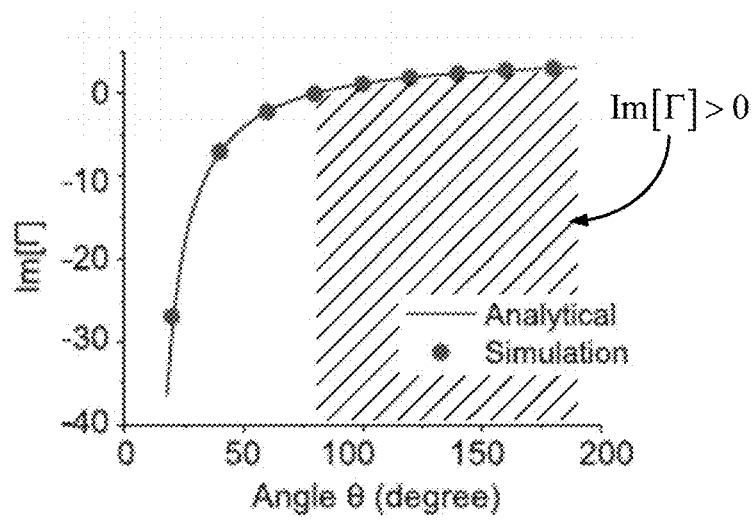
FIG. 7 shows an example relationship between arc angle of circular sectors filled with conductive fluid and the resulting reactance, Im[Γ].

As the arc angle θ changes from 20° to 180° (FIG. 7), Im[$\Gamma_n$] can be tuned from −29.3 (at 20°) to 2.94 (at 180°), sufficient to switch the desired eigenmode "off" and "on" during the excitation and reception.

There are two potential approaches to calculate the coupling coefficients $\kappa_{kn}$ among each unit cell: one is an analytical approach based on Neumann's theory of mutual inductance, and another is a full wave numerical simulation. The analytical approach is more computational efficient thus more readily adaptable in the field. It is noted that the Neumann's theory assumes the width of the inductor is negligible comparing to their distances, so the analytical approach may lead to increasing errors when the distances between coupling unit cells is reduced. When the distances between the coupling unit cells increase, the coupling coefficients $\kappa_{kn}$ decays.

Figures 8A, 8B, 8C:
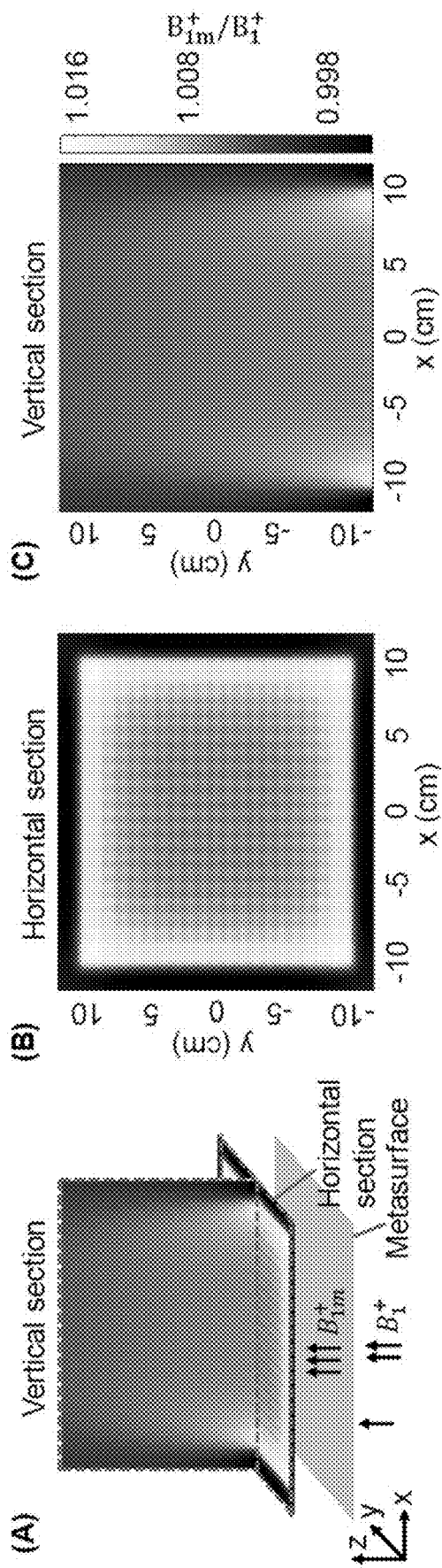
FIGS. 8A-8C show an example excitation field when the reactance of the unit cells is tuned to minimally disturbing the field.

A reconfigurable metamaterial/metasurface allows for selectively turning "off" and "on" the eigenmode in the excitation and reception of the MRI by changing the arc angle θ. During the excitation, a uniform $B_{1m}^+$ field distribution is desired, so the eigenmode of the metamaterial/metasurface is turned "off" by setting the angle θ of the second conductors of all unit cells at 20°. As shown in FIGS. 8A-8C, the $B_{1m}^+$ field remains mostly uniform, and the difference between $B_{1m}^+$ field and $B_1^+$ field is less than 1.6%, demonstrating the minimal influence of the metamaterial/metasurface during the excitation. During the reception, to enhance the $B_{1m}^-$ field thus the SNR in a region of interest, the Im[$\Gamma_n$] distribution is reset to switch "on" the eigenmode of the metamaterial.

FIGS. 8A-8C 2 illustrate an example excitation field when the reactance of the example metasurface is tuned to minimally disturbing the field in accordance with an embodiment of the present disclosure. FIG. 8A shows the magnetic field distribution with all 21×21 unit cells of an example metasurface that are turned "off" to provide a uniform excitation. All θ are tuned to 20° so Im[Γ] at 127 MHz is −29.3. The feeding field is linearly polarized uniform magnetic field with the field direction vertical to the metasurface plane. $B_1^+$ and $B_{1m}^+$ are the excitation field with and without the example metasurface, respectively. FIG. 8B shows the excitation field in the horizontal cross-section at 1 cm above the example metasurface, and FIG. 8C shows the excitation field in the vertical cross-section.

Figures 9A, 9B, 9C, 9D:
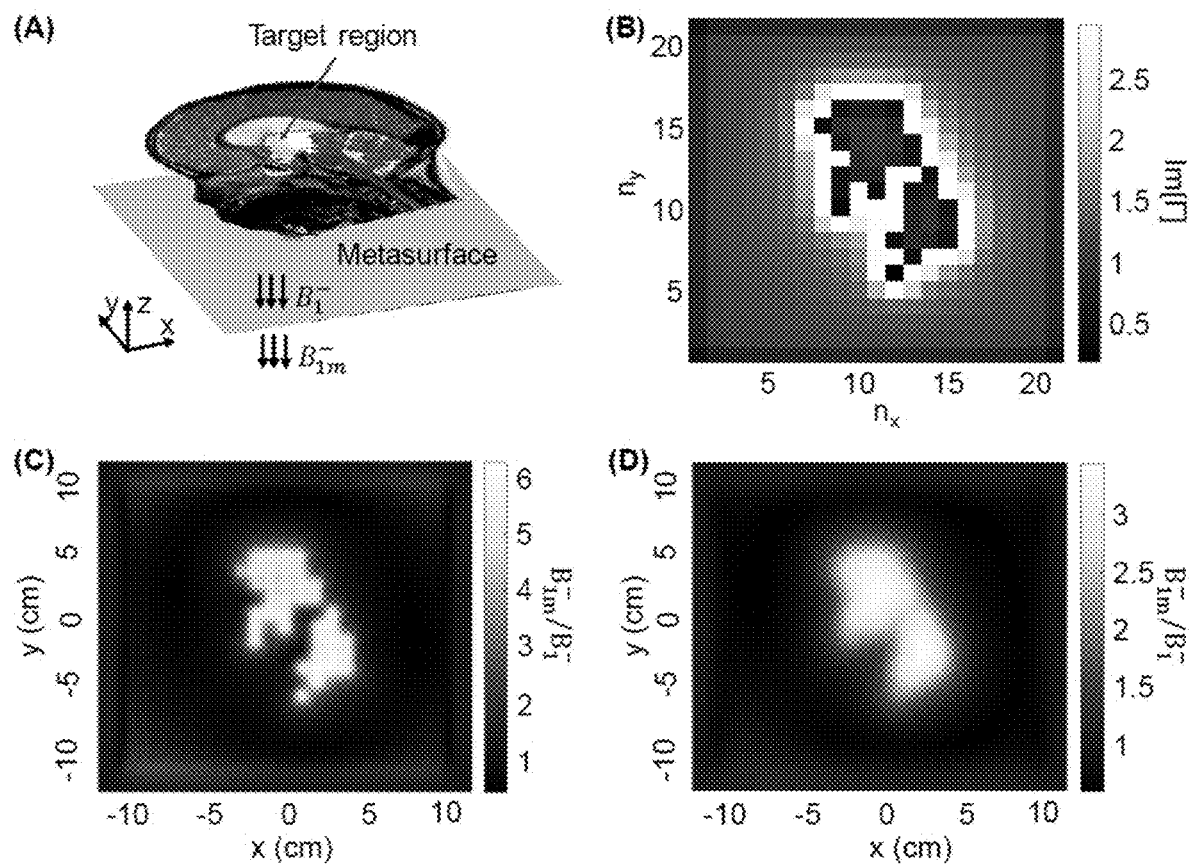
FIGS. 9A-9D illustrate an example use of a metasurface for an on-demand enhancement region of a brain tumor in accordance with an embodiment of the present disclosure.

In an example study to demonstrate this on-demand regional enhancement, a target region from a brain tumor MRI scan was sued, as shown in FIG. 9A. The goal of this study was to create an enhanced $B_{1m}^-$ field that matched the shape of the brain tumor and to minimize the $B_{1m}^-$ field elsewhere. To do so, ideally, the amplitude of the eigenmode $\alpha_{nt}$ outside of the tumor region should be 0 and inside the tumor should be 1. However, the desired eigenmode distribution is formed by the entire field both outside and inside the region of interest. Therefore, if the field amplitude outside the tumor is set to be 0 the desired enhancement cannot be achieved inside the tumor region. Instead, a target distribution with the field amplitude outside the tumor region can be chosen to be 0.1, and inside the tumor to be 1.

To achieve $\alpha_{nt}$ as 1 for the tumor region and 0.1 elsewhere, the reactance map of the metasurface can be designed as shown in FIG. 9B. This design shows that the $B_{1m}^-/B_1^-$ ratio can be enhanced 6.2 and 3.4 times, respectively, in the imaging planes at 1 cm and 2 cm above the metasurface (FIGS. 9C and 9D). Although the enhancement ratio decays gradually as the imaging plane moves away from the metasurface, the enhancement ratio remains at least 1.5 times at 5 cm above the metasurface.

Figures 10A, 10B, 10C, 10D, 10E, 10F, 10G:
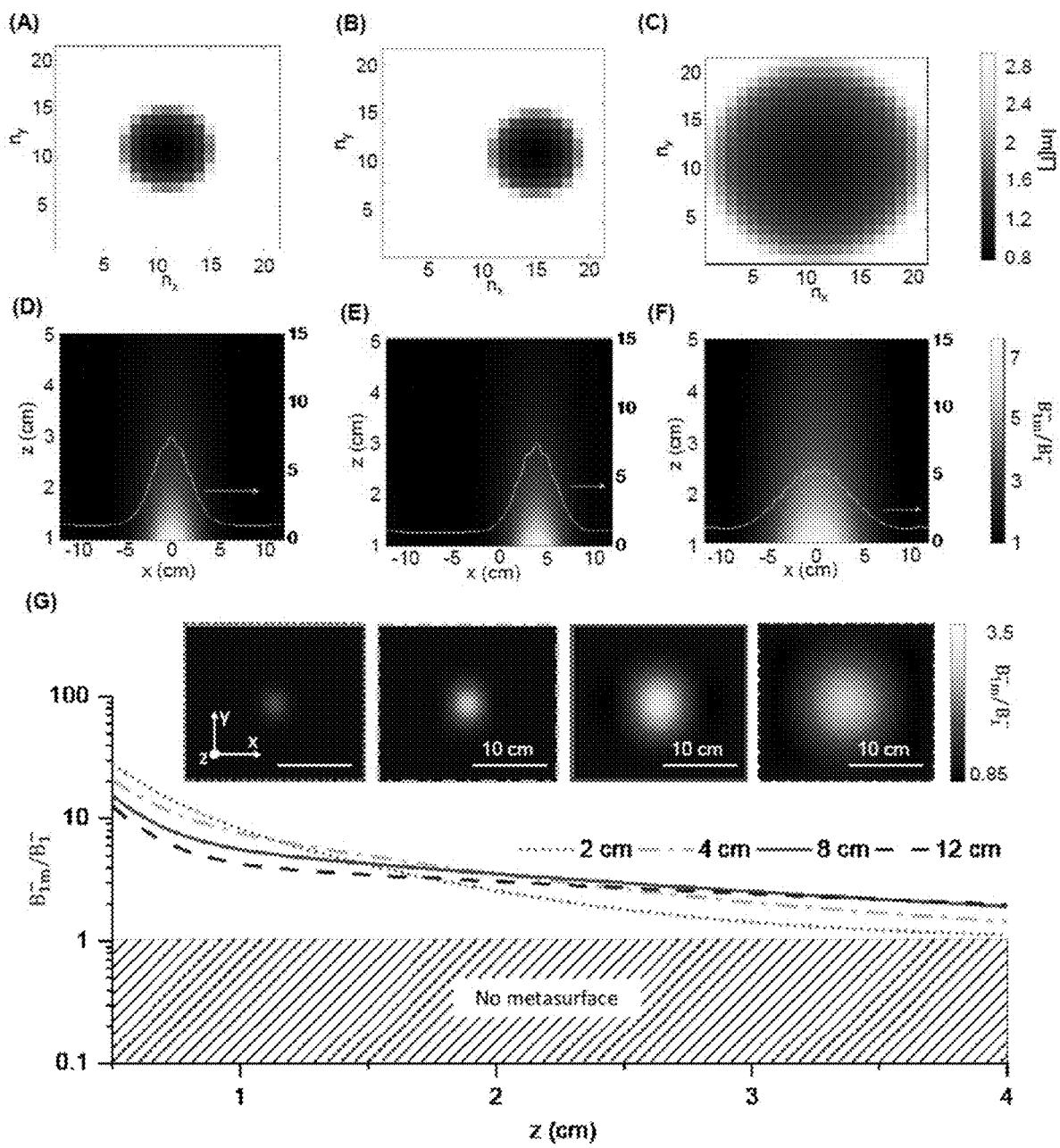
FIGS. 10A-10G show Gaussian fields with controllable field-width and position in accordance with an embodiment of the present disclosure.

Because of energy conservation, the enhancement ratio inevitably decays. By taking advantage of the reconfiguration of the metasurface, it is possible to redirect the energy and extend the enhancement region further with the cost of a relatively smaller enhancement ratio near the metasurface. This can be achieved by selectively "focusing" the field with a metasurface supporting non-uniform eigenmode, such as a Gaussian distribution. The intensity distribution of a Gaussian field is $$I(x, y) = \exp\left(-\frac{4\ln(2)\sqrt{(x-x_0)^2 + (y-y_0)^2}}{w^2}\right); \quad (3)$$

where w is the full width at half maximum ("FWHM"), $x_0$ and $y_0$ are the coordinate of the "focal point." FIGS. 10A and 10C show various Im[$\Gamma_n$] distributions of the metasurface, which targets a Gaussian eigenmode with a FWHM of 4 cm and 8 cm, respectively, with a focus location at (0 cm, 0 cm). When translating the Im[$\Gamma_n$] distribution, the "focal point" can be translated in the transverse plane, as seen in FIG. 10B, where the 4 cm-FWHM enhancement region is relocated to (0 cm, 4 cm).

The enhancement ratio at the focus depends on the FWHM of the field. The enhancement ratios of Gaussian fields with FWHM of 2 cm, 4 cm, 8 cm, and 12 cm can be calculated at various distances away from the metasurface to mimic imaging penetration. As shown in FIG. 10G, at a distance of 5 mm, the enhancement ratio at the "focal point" of 2 cm-FWHM-Gaussian field is 28; for 4 cm-, 8 cm- and 12 cm-fields, the enhancement ratios are 21, 15, and 12, respectively, which is 2-11 fold higher compared to other metamaterial designs at the same imaging depth. At such a distance, the enhancement ratio of a 2 cm-Gaussian field is shown to be 28 at the center of the field.

As seen in FIG. 10G, the decay rate of the signals along the z-direction is related to the designed FWHM of the Gaussian field. A broader targeted field will lead to a slower decay rate, but a lower initial intensity right above the metasurface because the energy is distributed to a larger area. To optimize the enhancement ratio at a certain depth, z, the field-width can be chosen by considering both the initial value and the decay rate. As compared in FIG. 10G, at 2.5 cm above the metasurface, the 8 cm-Gaussian field can achieve a relatively higher enhancement ratio than the 4 cm-Gaussian field by 12.17% due to its slower field decay, and a higher enhancement ratio than 12 cm-Gaussian field by 9.49% due to its higher initial intensity. In this way, the desired SNR-enhanced region can be controlled in three dimensions.

In many scenarios, the imaging region is not close to the surface of the subject. To receive the signal with a lower attenuation in depth, the RF coil is often chosen as a birdcage coil instead of a surface coil. In these instances, the excitation field is circularly polarized instead of linearly polarized, and the gap between the coil and the subject is cylindrical. Because aluminum oxide becomes flexible with micrometer thickness, the metasurface can be bendable and fit into the curved gap between the birdcage coil and the imaging subject.

Figures 11A, 11B, 11C, 11D, 11E, 11F, 11G, 11H, 11I:
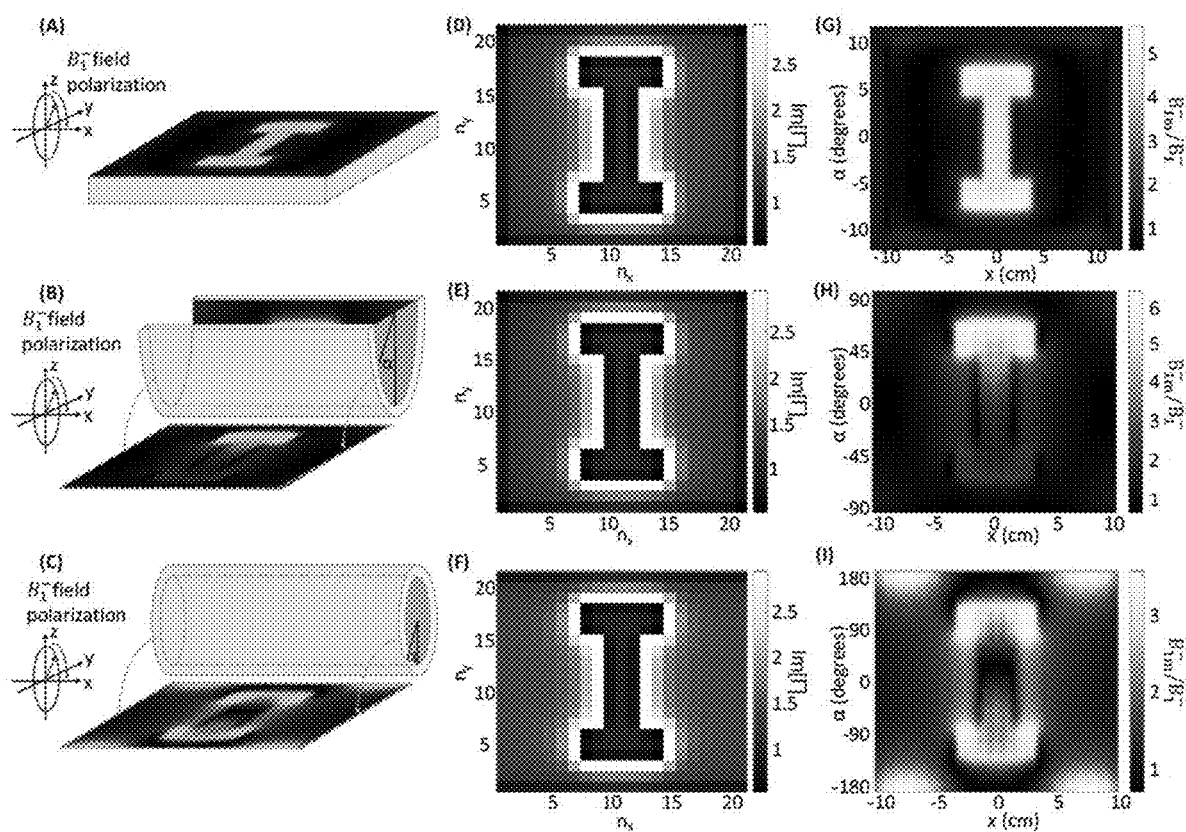
FIGS. 11A-11I show cylindrical metasurface to meet the need of curved imaging subjects in accordance with an embodiment of the present disclosure.

To test the performance of the metasurface with different bending curvature and circularly polarized $B_1^-$ field, a planar, half-cylindrical, and cylindrical metasurface were tested, as shown in FIGS. 11A-11C to achieve a desired imaging area that was shaped as the letter "I". FIGS. 11D and 11E show the calculated Im[Γ] map of the metasurface that remains relatively unchanged across the three different curvatures. The map remains largely unchanged because for certain targeted eigenmodes, Im[Γ] is mostly determined by the coupling coefficient (κ) between the neighboring unit cells. Because the unit cell is much smaller than the metasurface (e.g., with each unit cell taking only 0.23% of the area of the metasurface), the coupling coefficient between the neighboring unit cells is insensitive to the curvature. The imaginary part Im[Γ] of the intrinsic loss, Γ is much larger than its real part, Re[Γ]. The eigenmode of the metasurface can be linearly polarized (i.e., $\alpha_{nt}$ is in-phase). On the other hand, the $B_1^-$ field for a birdcage coil is circularly polarized (left handed), which mismatches with the eigenmode polarization. This mismatch can result in the distortion of $B_{1m}^-$ field, as shown in FIGS. 11G-11I, which increases with the curvature of the metasurface. Moreover, as the shape "I" is non-uniformly distributed among the rotational angle α, the $B_{1m}^-/B_1^-$ field is asymmetric with respect to α. Despite the distortion induced by the polarization mismatch, the enhancement ratio at a certain part of the "I" shape remains high. So the selective enhancement is still achievable for the scenarios using a birdcage coil.

Embodiments of the present disclosure include a design of reconfigurable metasurface for enhancing the receiving imaging signals on demand. In demonstrating an exemplary embodiment, a 3T $B_0$ field MRI scanner was assumed; however, the design principles described in the present disclosure can be readily extended to other static $B_0$ field strengths by slightly changing the unit cell parameters. In certain embodiments, the designed metasurface can boost the reception fields while posing little disruption to the excitation fields; notably, the designed enhancement ratio in a 3T-MRI is up to 28 times, while the disturbance of the excitation field is less than 1.6% across various imaging depth. These results demonstrate that on-demand enhancement in the MR images can be achieved without the need of increasing the local magnetic fields. By shaping the uniformity of the enhancement region, the tunability of the decay rate of the enhanced field across various imaging depths can also be shown, highlighting the flexibility in enhancing MR imaging in three dimensions.

Figure 13:
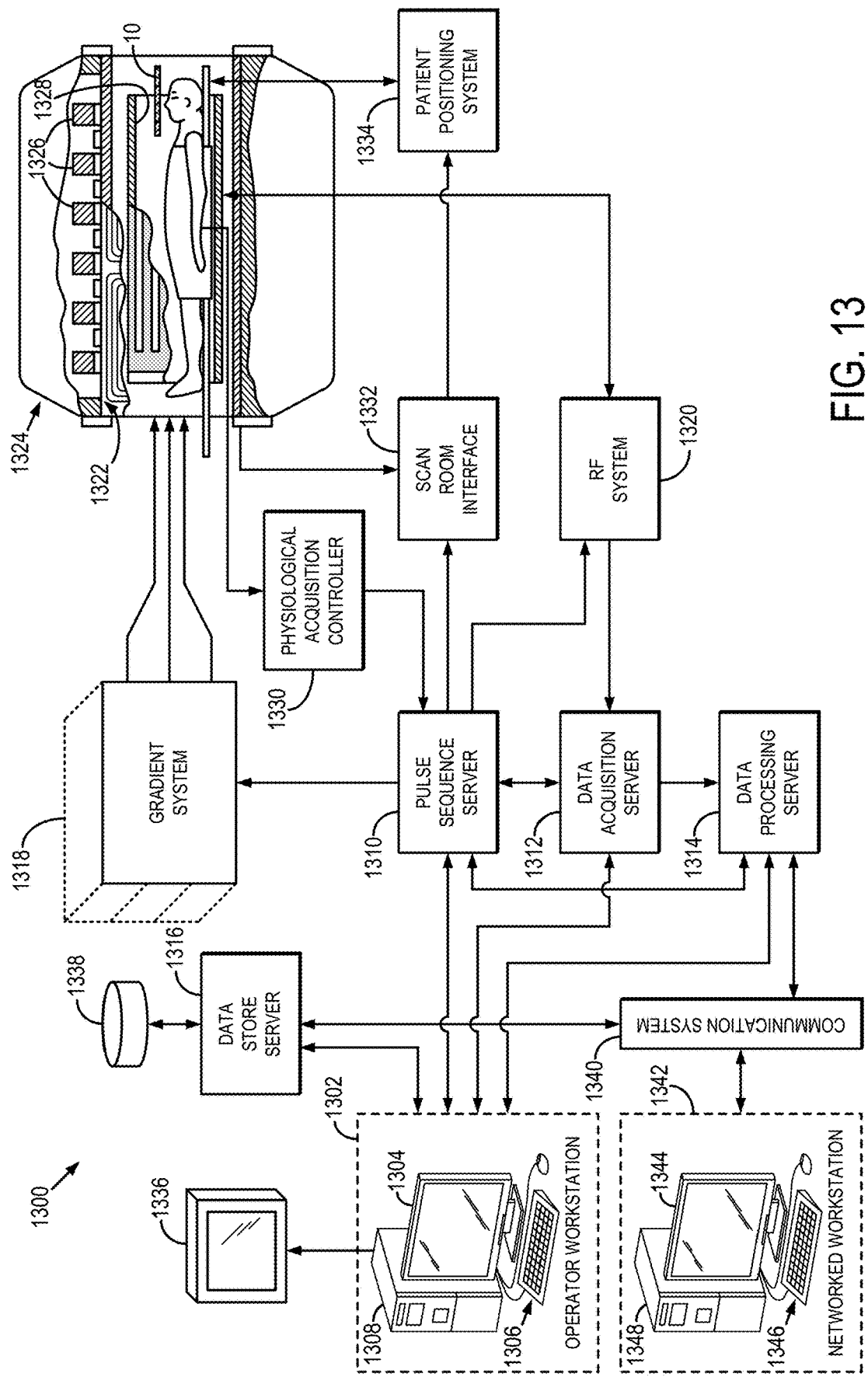
FIG. 13 is a block diagram of an example MRI system that can be used when implementing the metamaterials described in the present disclosure.

Referring particularly now to FIG. 13, an example of an MRI system 1300 that can implement the systems and methods described here is illustrated. The MRI system 1300 includes an operator workstation 1302 that may include a display 1304, one or more input devices 1306 (e.g., a keyboard, a mouse), and a processor 1308. The processor 1308 may include a commercially available programmable machine running a commercially available operating system. The operator workstation 1302 provides an operator interface that facilitates entering scan parameters into the MRI system 1300. The operator workstation 1302 may be coupled to different servers, including, for example, a pulse sequence server 1310, a data acquisition server 1312, a data processing server 1314, and a data store server 1316. The operator workstation 1302 and the servers 1310, 1312, 1314, and 1316 may be connected via a communication system 1340, which may include wired or wireless network connections.

The pulse sequence server 1310 functions in response to instructions provided by the operator workstation 1302 to operate a gradient system 1318 and a radiofrequency ("RF") system 1320. Gradient waveforms for performing a prescribed scan are produced and applied to the gradient system 1318, which then excites gradient coils in an assembly 1322 to produce the magnetic field gradients $G_x$, $G_y$, and $G_z$ that are used for spatially encoding magnetic resonance signals. The gradient coil assembly 1322 forms part of a magnet assembly 1324 that includes a polarizing magnet 1326 and a whole-body RF coil 1328.

RF waveforms are applied by the RF system 1320 to the RF coil 1328, or a separate local coil to perform the prescribed magnetic resonance pulse sequence. Responsive magnetic resonance signals detected by the RF coil 1328, or a separate local coil, are received by the RF system 1320. The responsive magnetic resonance signals may be amplified, demodulated, filtered, and digitized under direction of commands produced by the pulse sequence server 1310. The RF system 1320 includes an RF transmitter for producing a wide variety of RF pulses used in MRI pulse sequences. The RF transmitter is responsive to the prescribed scan and direction from the pulse sequence server 1310 to produce RF pulses of the desired frequency, phase, and pulse amplitude waveform. The generated RF pulses may be applied to the whole-body RF coil 1328 or to one or more local coils or coil arrays.

The RF system 1320 also includes one or more RF receiver channels. An RF receiver channel includes an RF preamplifier that amplifies the magnetic resonance signal received by the coil 1328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2};$$

and the phase of the received magnetic resonance signal may also be determined according to the following relationship:

$$\varphi = \tan^{-1}\left(\frac{Q}{I}\right).$$

As described above, a metamaterial (e.g., metamaterial 10) can be arranged between the imaging subject and the RF coil, which may be the whole-body RF coil 1328 of the MRI system 1300, or a local coil or coil array. The metamaterial 10 can be controlled in connection with the prescribed pulse sequence, such that the volume of conductive fluid in the second conductor 24 of each unit cell 20 of the metamaterial 10 is varied to switch the eigenmode of the metamaterial 10 depending on whether the RF system 1320 is operating in a transmission mode or a reception mode. For example, when operating in the transmission mode, such that a $B_1^+$ is being generated, then the eigenmode of the metamaterial 10 can be switched into an "off" state, such that phase disruptions caused by the $B_1^+$ field interacting with the metamaterial 10 are significantly reduced. When operating in the reception mode, such that a $B_1^-$ field is being received, the eigenmode of the metamaterial 10 can be switched into an "on" state, such that the reception field is enhanced, thereby increasing the SNR of the measured signal data.

The pulse sequence server 1310 may receive patient data from a physiological acquisition controller 1330. By way of example, the physiological acquisition controller 1330 may receive signals from a number of different sensors connected to the patient, including electrocardiograph ("ECG") signals from electrodes, or respiratory signals from a respiratory bellows or other respiratory monitoring devices. These signals may be used by the pulse sequence server 1310 to synchronize, or "gate," the performance of the scan with the subject's heart beat or respiration.

The pulse sequence server 1310 may also connect to a scan room interface circuit 1332 that receives signals from various sensors associated with the condition of the patient and the magnet system. Through the scan room interface circuit 1332, a patient positioning system 1334 can receive commands to move the patient to desired positions during the scan.

The digitized magnetic resonance signal samples produced by the RF system 1320 are received by the data acquisition server 1312. The data acquisition server 1312 operates in response to instructions downloaded from the operator workstation 1302 to receive the real-time magnetic resonance data and provide buffer storage, so that data is not lost by data overrun. In some scans, the data acquisition server 1312 passes the acquired magnetic resonance data to the data processor server 1314. In scans that require information derived from acquired magnetic resonance data to control the further performance of the scan, the data acquisition server 1312 may be programmed to produce such information and convey it to the pulse sequence server 1310. For example, during pre-scans, magnetic resonance data may be acquired and used to calibrate the pulse sequence performed by the pulse sequence server 1310. As another example, navigator signals may be acquired and used to adjust the operating parameters of the RF system 1320 or the gradient system 1318, or to control the view order in which k-space is sampled. In still another example, the data acquisition server 1312 may also process magnetic resonance signals used to detect the arrival of a contrast agent in a magnetic resonance angiography ("MRA") scan. For example, the data acquisition server 1312 may acquire magnetic resonance data and processes it in real-time to produce information that is used to control the scan.

The data processing server 1314 receives magnetic resonance data from the data acquisition server 1312 and processes the magnetic resonance data in accordance with instructions provided by the operator workstation 1302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 1314 are conveyed back to the operator workstation 1302 for storage. Real-time images may be stored in a data base memory cache, from which they may be output to operator display 1302 or a display 1336. Batch mode images or selected real time images may be stored in a host database on disc storage 1338. When such images have been reconstructed and transferred to storage, the data processing server 1314 may notify the data store server 1316 on the operator workstation 1302. The operator workstation 1302 may be used by an operator to archive the images, produce films, or send the images via a network to other facilities.

The MRI system 1300 may also include one or more networked workstations 1342. For example, a networked workstation 1342 may include a display 1344, one or more input devices 1346 (e.g., a keyboard, a mouse), and a processor 1348. The networked workstation 1342 may be located within the same facility as the operator workstation 1302, or in a different facility, such as a different healthcare institution or clinic.

The networked workstation 1342 may gain remote access to the data processing server 1314 or data store server 1316 via the communication system 1340. Accordingly, multiple networked workstations 1342 may have access to the data processing server 1314 and the data store server 1316. In this manner, magnetic resonance data, reconstructed images, or other data may be exchanged between the data processing server 1314 or the data store server 1316 and the networked workstations 1342, such that the data or images may be remotely processed by a networked workstation 1342.

The present disclosure has described one or more preferred embodiments, and it should be appreciated that many equivalents, alternatives, variations, and modifications, aside from those expressly stated, are possible and within the scope of the invention.

The invention claimed is:

1. A metamaterial for enhancing a reception field of a radio frequency (RF) receive coil for use with a magnetic resonance imaging (MRI) system, comprising:
   a periodic array of resonators, each resonator in the periodic array of resonators comprising a unit cell of the metamaterial, wherein each unit cell comprises:
   a substrate composed of an insulator;
   a first conductor arranged on one side of the substrate;
   a second conductor arranged on an opposite side of the substrate, wherein the second conductor comprises a microfluidic channel containing a conductive fluid; and
   wherein varying a volume of the conductive fluid in the second conductor of each unit cell changes a reactance distribution a of the periodic array of resonators.

2. The metamaterial of claim 1, wherein the volume of the conductive fluid in the second conductor of each unit cell is variable between a first volume and a second volume, such that when at the first volume the periodic array of resonators is in a first eigenmode and when at the second volume the periodic array of resonators is in a second eigenmode that enhances reception RF fields more and is less sensitive to transmission RF fields than the first eigenmode.

3. The metamaterial of claim 1, wherein the microfluidic channel is a circular channel.

4. The metamaterial of claim 3, wherein varying the volume of the conductive fluid in the second conductor of each unit cell changes an arc angle of a radial sector of the circular channel that is filled with the conductive fluid.

5. The metamaterial of claim 4, wherein the volume of the conductive fluid in the second conductor of each unit cell is variable between a first volume and a second volume, such that when at the first volume the periodic array of resonators is in a first eigenmode and when at the second volume the periodic array of resonators is in a second eigenmode that enhances reception RF fields more and is less sensitive to transmission RF fields than the first eigenmode.

6. The metamaterial of claim 5, wherein the arc angle of the radial sector of the circular channel that is filled with the conductive fluid at the first volume is between 10 and 30 degrees and the arc angle of the radial sector of the circular channel that is filled with the conductive fluid at the second volume is between 170 and 190 degrees.

7. The metamaterial of claim 6, wherein the arc angle of the radial sector of the circular channel that is filled with the conductive fluid at the first volume is 20 degrees and the arc angle of the radial sector of the circular channel that is filled with the conductive fluid at the second volume is 180 degrees.

8. The metamaterial of claim 3, wherein the first conductor of each unit cell is an annular ring composed of a solid conductor, wherein the annular ring is concentric with the circular channel.

9. The metamaterial of claim 8, wherein the annular ring and circular channel have a same radial width.

10. The metamaterial of claim 3, wherein the first conductor of each unit cell is an annular ring composed of a solid conductor, wherein the annular ring is offset from the circular channel such that the annular ring and the circular channel partially overlap.

11. The metamaterial of claim 1, wherein the conductive fluid is a liquid metal.

12. The metamaterial of claim 11, wherein the liquid metal comprises mercury.

13. The metamaterial of claim 11, wherein the liquid metal comprises a eutectic alloy.

14. The metamaterial of claim 13, wherein the eutectic alloy comprises a eutectic gallium-indium alloy.

15. The metamaterial of claim 1, wherein the first conductor of each unit cell is composed of a solid conductor.

16. The metamaterial of claim 15, wherein the solid conductor is composed of copper.

17. The metamaterial of claim 1, wherein the substrate is composed of aluminum oxide.

18. The metamaterial of claim 1, wherein the substrate of each unit cell comprises a single continuous substrate.

19. The metamaterial of claim 18, wherein the continuous substrate is a flat planar surface.

20. The metamaterial of claim 18, wherein the continuous substrate is a curved surface.

21. The metamaterial of claim 1, wherein the substrate is composed of a flexible material.

22. The metamaterial of claim 21, wherein the flexible material is composed of aluminum oxide having a thickness sufficiently thin so as to be flexible.

23. The metamaterial of claim 1, wherein the first conductor in each unit cell has a thickness between 1.4 $\mu$m and 1.6 $\mu$m, the substrate in each unit cell has a thickness between 0.8 $\mu$m and 1.2 $\mu$m, and the second conductor in each unit cell has a thickness between 400 $\mu$m and 600 $\mu$m.

24. The metamaterial of claim 23, wherein the first conductor in each unit cell has a thickness of 1.2 $\mu$m, the substrate in each unit cell has a thickness of 1 $\mu$m, and the second conductor in each unit cell has a thickness of 500 $\mu$m.

* * * * *

UNITED STATES PATENT AND TRADEMARK OFFICE
CERTIFICATE OF CORRECTION

| | |
|---|---|
| PATENT NO. | : 11,733,326 B2 |
| APPLICATION NO. | : 17/560505 |
| DATED | : August 22, 2023 |
| INVENTOR(S) | : Yang Zhao, Yun-Sheng Chen and Hanwei Wang |

It is certified that error appears in the above-identified patent and that said Letters Patent is hereby corrected as shown below:

In the Claims

Claim 1, Column 16, Line 36, "distribution a of the periodic array of resonators." should be --distribution of the periodic array of resonators.--.

Signed and Sealed this
Nineteenth Day of September, 2023

Katherine Kelly Vidal
*Director of the United States Patent and Trademark Office*